US012777938B2

(12) United States Patent
Yamamoto et al.

(10) Patent No.: US 12,777,938 B2
(45) Date of Patent: Oct. 27, 2026

(54) SEMICONDUCTOR DEVICE

(71) Applicant: Renesas Electronics Corporation, Tokyo (JP)

(72) Inventors: Yuki Yamamoto, Tokyo (JP); Hiroyuki Arie, Tokyo (JP)

(73) Assignee: Renesas Electronics Corporation, Tokyo (JP)

(*) Notice: Subject to any disclaimer, the term of this patent is extended or adjusted under 35 U.S.C. 154(b) by 354 days.

(21) Appl. No.: 18/435,425

(22) Filed: Feb. 7, 2024

(65) Prior Publication Data

US 2024/0304566 A1 Sep. 12, 2024

(30) Foreign Application Priority Data

Mar. 7, 2023 (JP) ................................ 2023-034414

(51) Int. Cl.

| | |
|---|---|
| ***H10W 42/00*** | (2026.01) |
| ***H10D 30/01*** | (2025.01) |
| ***H10D 30/65*** | (2025.01) |
| ***H10P 30/20*** | (2026.01) |
| ***H10W 20/00*** | (2026.01) |
| ***H10W 20/42*** | (2026.01) |

(52) U.S. Cl.

CPC ...... *H10W 42/121* (2026.01); *H10D 30/0281* (2025.01); *H10D 30/65* (2025.01); *H10P 30/204* (2026.01); *H10P 30/21* (2026.01); *H10W 20/01* (2026.01); *H10W 20/42* (2026.01)

(58) Field of Classification Search

None

See application file for complete search history.

(56) References Cited

U.S. PATENT DOCUMENTS

| | | | | |
|---|---|---|---|---|
| 6,707,156 B2 * | 3/2004 | Suzuki ................ | H10W 20/435 257/E23.152 |
| 8,952,555 B2 * | 2/2015 | Koketsu ................ | H10D 30/60 257/797 |
| 11,289,363 B2 | 3/2022 | Tokumitsu et al. | |
| 2014/0125421 A1 * | 5/2014 | Miyazaki .............. | H10B 43/40 331/111 |
| 2021/0249353 A1 * | 8/2021 | Sayama ............. | H10W 10/014 |

FOREIGN PATENT DOCUMENTS

| | | |
|---|---|---|
| JP | 2021-9865 A | 1/2021 |

* cited by examiner

*Primary Examiner* — Nilufa Rahim

(74) *Attorney, Agent, or Firm* — Rimon P.C.

(57) ABSTRACT

A semiconductor device includes a semiconductor substrate having a first main surface and a second main surface, a plurality of interlayer dielectric films, and a plurality of wiring layers stacked above the first main surface. Each of the plurality of interlayer dielectric films is interposed between two adjacent ones of the plurality of wiring layers and between one of the plurality of wiring layers closest to the first main surface in a first direction and the first main surface. A trench recessed toward the second main surface is formed on the first main surface. The trench includes a straight portion extending along a second direction. The plurality of wiring layers has a first wiring layer farthest from the first main surface in the first direction and a second wiring layer farthest from the first main surface next to the first wiring layer in the first direction.

13 Claims, 20 Drawing Sheets

SEMICONDUCTOR DEVICE

CROSS-REFERENCE TO RELATED APPLICATIONS

The disclosure of Japanese Patent Application No. 2023-034414 filed on Mar. 7, 2023, including the specification, drawings and abstract is incorporated herein by reference in its entirety.

BACKGROUND

The present disclosure relates to a semiconductor device. There is a disclosed technique listed below.

[Patent Document 1] Japanese Unexamined Patent Application Publication No. 2021-9865

For example, Patent Document 1 describes a semiconductor device. The semiconductor device described in Patent Document 1 includes a semiconductor substrate, a plurality of wirings, and a plurality of interlayer dielectric films. The semiconductor substrate has a main surface. The plurality of wirings are stacked above the main surface. A trench is formed on the main surface. A dielectric film is embedded in the trench.

A wiring farthest from the main surface in the normal direction of the main surface is defined as the uppermost layer wiring. An interlayer dielectric film is interposed between two adjacent wirings. The interlayer dielectric film is also interposed between the wiring which is closest to the main surface in the normal direction of the main surface and the main surface.

SUMMARY

In the semiconductor device described in Patent Document 1, a crack may occur in the interlayer dielectric film in the vicinity of the end of wiring portion of the uppermost layer wiring, and the crack may extend in the interlayer dielectric film toward trench. Other objects and novel features will become apparent from the description of this specification and the accompanying drawings.

A semiconductor device of the present disclosure includes a semiconductor substrate having a first main surface and a second main surface which is an opposite surface of the first main surface, a plurality of interlayer dielectric films stacked on the first main surface along a first direction which is a normal direction of the first main surface, and a plurality of wirings. A trench recessed toward the second main surface is formed on the first main surface. The trench includes a straight portion extending in a second direction orthogonal to the first direction. The plurality of interlayer dielectric films includes a first interlayer dielectric film farthest from the first main surface in the first direction, and a second interlayer dielectric film in contact with the first interlayer dielectric film in the first direction. The plurality of wirings includes a first wiring disposed on the first interlayer dielectric film, and a second wiring disposed on the second interlayer dielectric film so as to be covered with the first interlayer dielectric film. The first wiring includes a first wiring portion. In a third direction orthogonal to the first direction and the second direction, the first wiring portion includes a first end and a second end which is an opposite end of the first end. The second wiring includes a second wiring portion. In the third direction, the second wiring portion includes a third end and a fourth end which is an opposite end of the third end. A distance between the straight portion and the first end in the third direction is smaller than a distance between the straight portion and the second end in the third direction, and is 0.5 times or less than a first thickness which is a thickness of the first wiring. A distance between the first end and the third end in the third direction is smaller than a distance between the first end and the fourth end in the third direction, and is greater than 0.5 times the first thickness.

According to the semiconductor device of the present disclosure, it is possible to suppress the crack from extending in the interlayer dielectric film in the vicinity of the first wiring portion.

DETAILED DESCRIPTION

Figure 1:
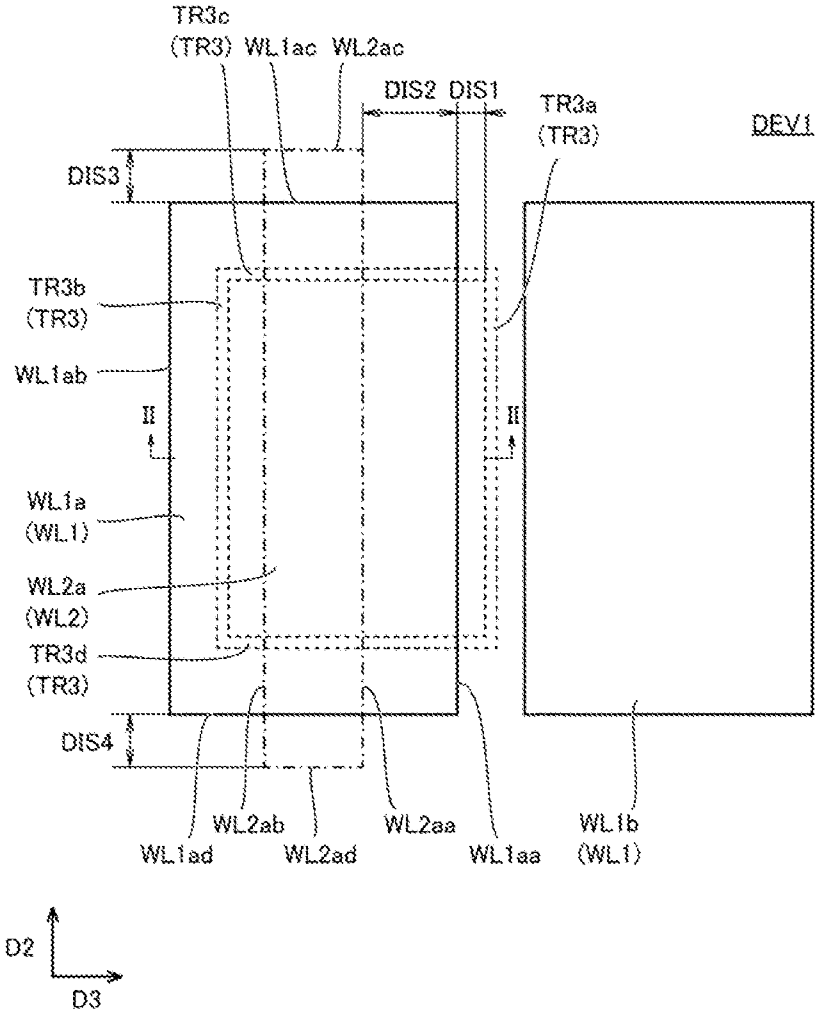
FIG. 1 is a plan view of a semiconductor device DEV1.

Embodiments of the present disclosure will be described with reference to the drawings. In the following drawings, the same or corresponding parts are denoted by the same reference numerals, and redundant description will not be repeated.

First Embodiment

A semiconductor device according to the first embodiment will be described. The semiconductor device according to the first embodiment is a semiconductor device DEV1.

Configuration of Semiconductor Device DEV1

The configuration of the semiconductor device DEV1 will be described below.

Figure 2:
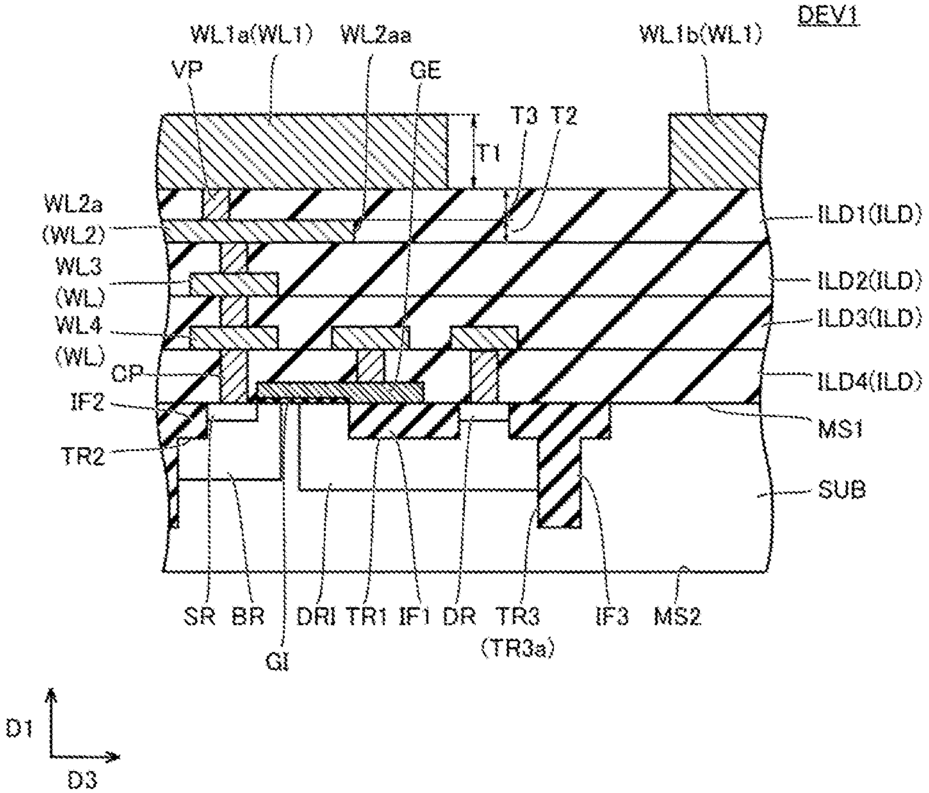
FIG. 2 is a cross-sectional view in II-II of FIG. 1.

FIG. 1 is a plan view of the semiconductor device DEV1. FIG. 2 is a cross-sectional view of the semiconductor device DEV1 along II-II of FIG. 1. As shown in FIGS. 1 and 2, the semiconductor device DEV1 includes a semiconductor substrate SUB, a dielectric film IF1, a dielectric film IF2, a dielectric film IF3, a gate dielectric film GI, a gate electrode GE, a plurality of wirings WL, and a plurality of interlayer dielectric films ILD.

The semiconductor substrate SUB has a main surface MS1 and a main surface MS2. The main surface MS2 is disposed opposite to the main surface MS1. A normal direction of the main surface MS1 is defined as a first direction D1. The main surface MS2 is disposed opposite to the main surface MS1 in the first direction D1. The semiconductor substrate SUB is formed of, for example, a single crystal silicon (Si). The semiconductor substrate SUB may be a stacked structure having a semiconductor substrate and an epitaxial growth layer formed on the semiconductor substrate. In this case, a source region SR, a drain region DR, a body region BR, and a drift region DRI, which will be described later, are formed in the epitaxial growth layer.

The semiconductor substrate SUB includes a source region SR, a drain region DR, a body region BR, and a drift region DRI. The conductivity type of the source region SR, the conductivity type of the drain region DR, and the conductivity type of the drift region DRI are the first conductivity type. The conductivity type of the body region BR is the second conductivity type. The second conductivity type is the opposite conductivity type of the first conductivity type. For example, when the first conductivity type is n-type, the second conductivity type is p-type. The dopant concentration in the source region SR and the dopant concentration in the drain region DR are higher than the dopant concentration in the drift region DRI.

The source region SR is disposed on the main surface MS1. The drain region DR is disposed on the main surface MS1. The source region SR and the drain region DR are disposed spaced apart from each other. The body region BR is disposed on the main surface MS1 so as to surround the source region SR. The drift region DRI is disposed so as to surround the drain region DR.

A trench TR1 is formed on the main surface MS1. The trench TR1 is recessed toward the main surface MS2. The trench TR1 is disposed next to the drain region DR, and between the source region SR and the drain region DR. The trench TR1 is surrounded by the drift region DRI. A dielectric film IF1 is embedded in the trench TR1. The dielectric film IF1 is formed of, for example, silicon oxide. That is, the dielectric film IF1 has an STI (Shallow Trench Isolation) structure. Instead of the STI structure, the dielectric film IF1 may have a LOCOS (LOCal Oxidation of Silicon) structure. If the breakdown voltage between the drain region DR and the gate electrode GE is sufficiently secured, STI or LOCOS may not be formed.

A gate dielectric film GI is disposed on a part of the main surface MS1 between the source region SR and the trench TR1. The gate dielectric film GI is formed of, for example, silicon oxide. A gate electrode GE is disposed on the gate dielectric film GI. The gate electrode GE is formed of, for example, polycrystalline silicon that contains dopants. The source region SR, the drain region DR, the body region BR, the drift region DRI, the gate dielectric film GI, and the gate electrode GE constitute a transistor. This transistor is an LDMOSFET (Laterally Diffused Metal Oxide Semiconductor Field Effect Transistor).

A trench TR2 and a trench TR3 are further formed on the main surface MS1. The trench TR2 is recessed toward the main surface MS2. The trench TR2 is formed to surround the transistor in plan view. A dielectric film IF2 is embedded in the trench TR2. The dielectric film IF2 is formed of, for example, silicon oxide. The bottom of trench TR2 is arranged, for example, closer to the main surface MS1 than the bottom of the drift region DRI is to the main surface MS1.

The trench TR3 is formed on a part of the main surface MS1 where the bottom of the trench TR2 is located. The trench TR3 is recessed toward the main surface MS2. The bottom of trench TR3 is arranged closer to the main surface MS2 than the bottom of the drift region DRI is to the main surface MS2. In FIG. 1, the position of the trench TR3 is indicated by a dotted line. The dielectric film IF3 is embedded in the trench TR3. The dielectric film IF3 is formed of, for example, silicon oxide.

The trench TR3 includes a straight portion TR3*a*, a straight portion TR3*b*, a straight portion TR3*c*, and a straight portion TR3*d*. The straight portion TR3*a* and the straight portion TR3*b* extend along the second direction D2. The straight portion TR3*c* and the straight portion TR3*d* extend along a third direction D3. The second direction D2 is orthogonal to the first direction D1, and the third direction D3 is orthogonal to both the first direction D1 and the second direction D2. The straight portion TR3*a* includes one end and the other end opposite to the one end in the second direction D2. The one end and the other end of the straight portion TR3*a* are connected to the straight portion TR3*c* and the straight portion TR3*d*, respectively. The straight portion TR3*b* includes one end and the other end opposite to the one end in the second direction D2. The one end and the other end of the straight portion TR3*b* are connected to the straight portion TR3*c* and the straight portion TR3*d*, respectively. In another aspect, the trench TR3 is rectangular and circular in plan view.

The plurality of interlayer dielectric films ILD are stacked on the main surface MS1 along the first direction D1. The plurality of interlayer dielectric films ILD is formed of, for example, silicon oxide. In the embodiment shown in FIG. 2, the number of the plurality of interlayer dielectric films is four. However, the number of the plurality of interlayer dielectric films ILD may be two or more. The interlayer dielectric film ILD disposed farthest from the main surface MS1 in the first direction D1 is referred to as an interlayer dielectric film ILD1. The interlayer dielectric film ILD1 is the uppermost interlayer dielectric film of the plurality of interlayer dielectric films ILD. The interlayer dielectric film disposed in contact with the interlayer dielectric film ILD1 in the first direction D1 is referred to as an interlayer dielectric film ILD2. In the first direction D1, the interlayer dielectric film disposed in contact with a side of the interlayer dielectric film ILD2 that is opposite to a side of the interlayer dielectric film ILD2 that contacts the interlayer dielectric film ILD1 is referred to as an interlayer dielectric film ILD3. In the first direction D1, the interlayer dielectric film disposed in contact with a side of the interlayer dielectric film ILD3 that is opposite to a side of the interlayer dielectric film ILD3 that contacts the interlayer dielectric film ILD2 is referred to as an interlayer dielectric film ILD4.

The plurality of wirings WL are stacked over the main surface MS1. As shown in FIG. 2, the plurality of wirings WL includes a wiring WL1, a wiring WL2, a wiring WL3, and a wiring WL4. In the embodiment shown in FIG. 2, the number of the plurality of wirings WL is four. However, the number of the plurality of wirings WL may be two or more. The wiring WL is formed of, for example, aluminum (Al) or an aluminum alloy.

The wiring WL1 is disposed on the interlayer dielectric film ILD1, that is, the wiring WL1 is a wiring WL of the uppermost layer. The wiring WL2 is disposed on the interlayer dielectric film ILD2 and covered with the interlayer dielectric film ILD1. The wiring WL3 is disposed on the interlayer dielectric film ILD3 and covered with the interlayer dielectric film ILD2. The wiring WL4 is disposed on the interlayer dielectric film ILD4 and covered with the interlayer dielectric film ILD3. In the embodiment shown in FIG. 2, the wiring WL4 is one of the plurality of wirings WL that is disposed closest to the main surface MS1 in the first direction D1.

A thickness T1 of the wiring WL1 is, for example, greater than a thickness T2 of the wiring WL2. The thickness T1 is preferably 5 times or more, 7 times or more, or 10 times or more of the thickness T2. A thickness T3 of the interlayer dielectric film ILD2 on the wiring WL2 is preferably 0.5 μm or more, 1.0 μm or more, or 1.5 μm or more.

The wiring WL1 includes a wiring portion WL1*a* and a wiring portion WL1*b*. The wiring portion WL1*a* and the wiring portion WL1*b* are arranged spaced apart from each other in the third direction D3. The third direction D3 is orthogonal to the first direction D1 and the second direction D2.

The wiring portion WL1*a* includes an end WL1*aa* and an end WL1*ab* opposite to the end WL1*aa* in the third direction D3. The end WL1*aa* and the wiring portion WL1*b* face each other with a distance between the end WL1*aa* and the wiring portion WL1*b*. A distance DIS1 between the end WL1*aa* and the straight portion TR3*a* in the third direction D3 is smaller than a distance between the end WL1*ab* and the straight portion TR3*a* in the third direction D3. The straight portion TR3*a* is disposed, for example, between the wiring portion WL1*a* and the wiring portion WL1*b*. The distance DIS1 is 0.5 times or less of the thickness T1.

For example, a distance between the end WL1*ab* and the straight portion TR3*b* in the third direction D3 is smaller than a distance between the end WL1*aa* and the straight portion TR3*b* in the third direction D3. The straight portion TR3*b* overlaps with, for example, the wiring portion WL1*a* in plan view. The distance between the end WL1*ab* and the straight portion TR3*b* in the third direction D3 may be 0.5 times or less of the thickness T1 of the wiring WL1 and may be greater than 0.5 times the thickness T1 of the wiring WL1.

The wiring portion WL1*a* includes an end WL1*ac* and an end WL1*ad* opposite to the end WL1*ac* in the second direction D2. For example, the distance between the end WL1*ac* and the straight portion TR3*c* in the second direction D2 is smaller than the distance between the end WL1*ad* and the straight portion TR3*c* in the second direction D2. For example, the distance between the end WL1*ad* and the straight portion TR3*d* in the second direction D2 is smaller than the distance between the end WL1*ac* and the straight portion TR3*d* in the second direction D2. The straight portion TR3*c* and the straight portion TR3*d* overlap with, for example, the wiring portion WL1*a* in plan view. The distance between the end WL1*ac* and the straight portion TR3*c* in the second direction D2 and the distance between the end WL1*ad* and the straight portion TR3*d* in the second direction D2 may be 0.5 times or less of the thickness T1 of the wiring WL1 and may be greater than 0.5 times the thickness T1 of the wiring WL1.

The wiring WL2 includes a wiring portion WL2*a*. In FIG. 1, the wiring portion WL2*a* is indicated by a dotted line. The wiring portion WL2*a* includes an end WL2*aa* and an end WL2*ab* opposite to the end WL2*aa* in the third direction D3. The wiring portion WL2*a* includes an end WL2*ac* and an end WL2*ad* opposite to the end WL2*ac* in the second direction D2.

The end WL2*aa* is disposed, for example, between the end WL1*aa* and the end WL1*ab* in the third direction D3. That is, the end WL2*aa* overlaps with, for example, the wiring portion WL1*a* in plan view. The end WL2*aa* may not overlap with the wiring portion WL1*a* in plan view. A distance DIS 2 between the end WL1*aa* and the end WL2*aa* in the third direction D3 is smaller than the distance between the end WL1*aa* and the end WL2*ab* in the third direction D3. The distance DIS2 is greater than 0.5 times the thickness T1 of the wiring WL1.

The end WL2*ab* is disposed, for example, between the end WL1*aa* and the end WL1*ab* in the third direction D3. That is, the end WL2*ab* may overlap with the wiring portion WL1*a* in plan view, for example. The end WL2*ab* may not be disposed between the end WL1*aa* and the end WL1*ab* in the third direction D3. Here, the distance between the end WL2*ab* and the end WL1*aa* in the third direction D3 is greater than the distance between the end WL2*ab* and the end WL1*ab* in the third direction D3.

A distance DIS3 between the end WL1*ac* and the end WL2*ac* in the second direction D2 is smaller than the distance between the end WL1*ac* and the end WL2*ad*. A distance DIS4 between the end WL1*ad* and the end WL2*ad* in the second direction D2 is smaller than the distance between the end WL1*ad* and the end WL2*ac* in the second direction D2. The distance DIS3 and the distance DIS4 may be smaller than the distance DIS2 between the end WL1*aa* and the end WL2*aa* in the third direction D3. The distance DIS3 and the distance DIS4 are preferably greater than 0.5 times the thickness T1 of the wiring WL1.

The two wirings WL, of the plurality of wirings WL, next to each other are electrically connected by a via plug VP. The via plug VP is embedded in a via hole formed in the interlayer dielectric film ILD interposed between two wirings WL next to each other. The wiring WL4 is electrically connected to the source region SR, the drain region DR, and the gate electrode GE by a contact plug CP. The contact plug CP is embedded in a contact hole formed in the interlayer dielectric film ILD (interlayer dielectric film ILD1) interposed between the wiring WL4 and the main surface MS1. The via plug VP and the contact plug CP are formed of, for example, tungsten (W).

Manufacturing Method of Semiconductor Device DEV1

The manufacturing method of the semiconductor device DEV1 is described below.

Figure 3:
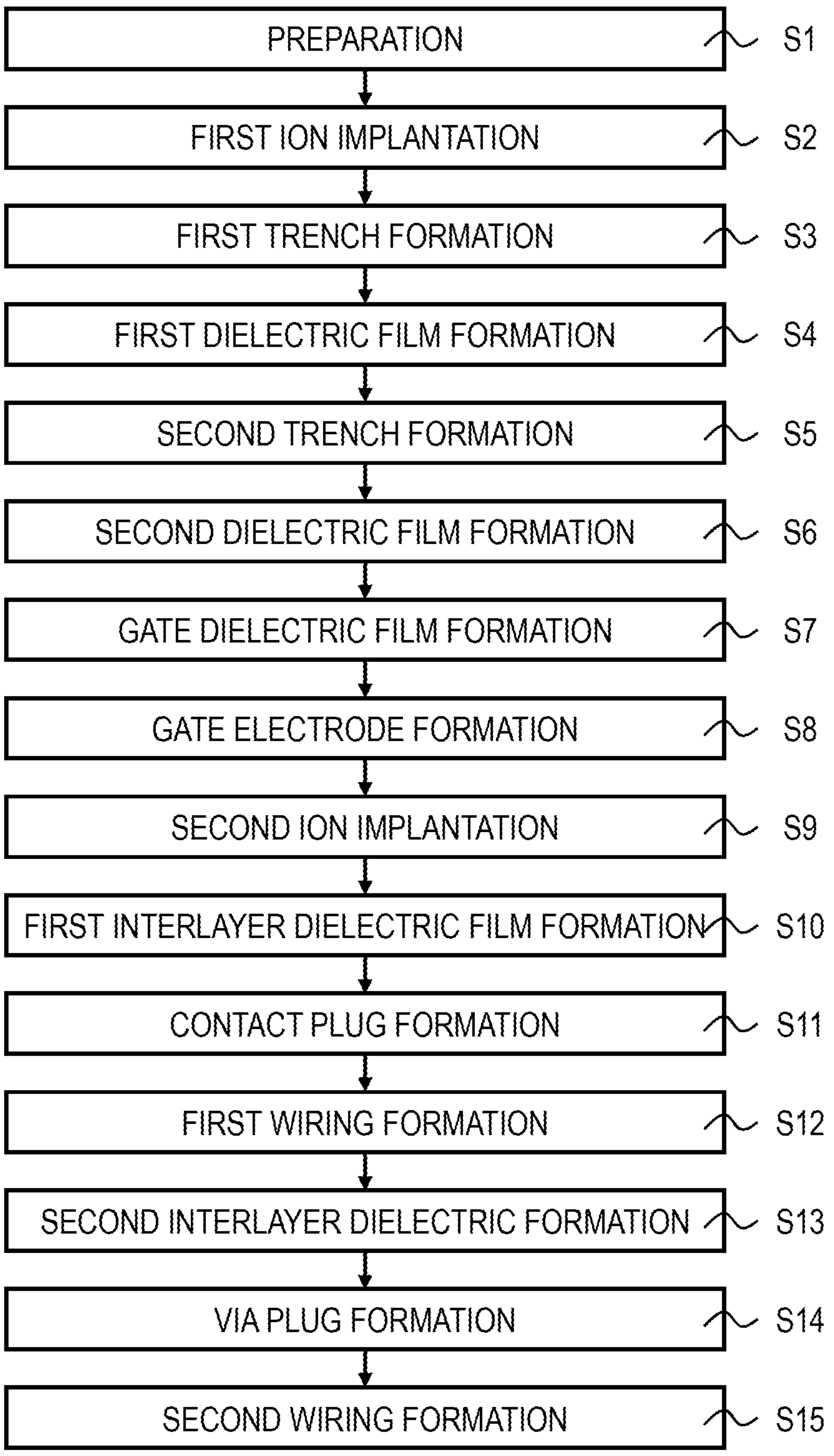
FIG. 3 is a manufacturing process diagram of the semiconductor device DEV1.

FIG. 3 is a manufacturing process diagram of the semiconductor device DEV1. As shown in FIG. 3, the manufacturing method of the semiconductor device DEV1 includes a preparation step S1, a first ion implantation step S2, a first trench forming step S3, a first dielectric film forming step S4, a second trench forming step S5, a second dielectric film forming step S6, a gate dielectric film forming step S7, a gate electrode forming step S8, and a second ion implantation step S9.

The manufacturing method of the semiconductor device DEV1 further includes a first interlayer dielectric film forming step S10, a contact plug forming step S11, a first wiring forming step S12, a second interlayer dielectric film forming step S13, a via plug forming step S14, and a second wiring forming step S15.

Figure 4:
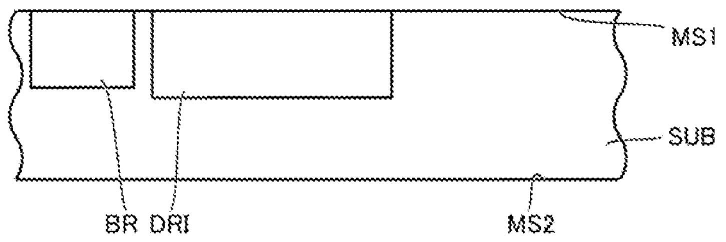
FIG. 4 is a cross-sectional view showing a first ion implantation step S2.

In the preparation step S1, a semiconductor substrate SUB including a main surface MS1 and a main surface MS2 is prepared. The semiconductor substrate SUB prepared in the preparation step S1 may be a stacked structure including a semiconductor substrate and an epitaxial growth layer formed on the semiconductor substrate. FIG. 4 is a cross-sectional view showing the first ion implantation step S2. As shown in FIG. 4, in the first ion implantation step S2, the body region BR and the drift region DRI are formed on the main surface MS1 by ion implantation.

Figure 5:
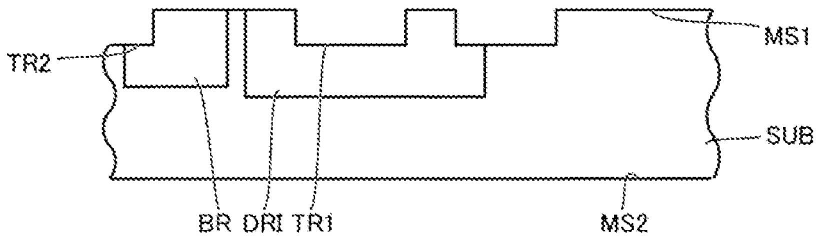
FIG. 5 is a cross-sectional view showing a first trench forming step S3.
Figure 6:
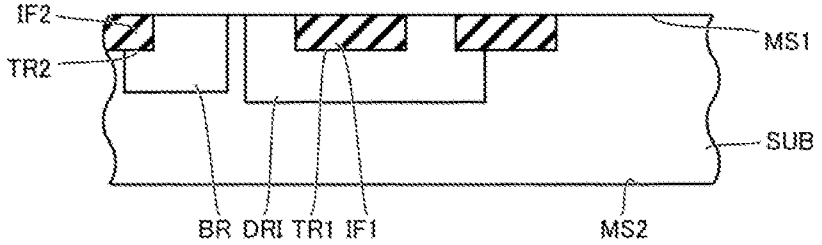
FIG. 6 is a cross-sectional view showing a first dielectric film forming step S4.

FIG. 5 is a cross-sectional view showing the first trench forming step S3. As shown in FIG. 5, in the first trench forming step S3, the trench TR1 and the trench TR2 are formed on the main surface MS1. The trench TR1 and the trench TR2 are formed by, for example, an anisotropic dry etching. FIG. 6 is a cross-sectional view showing the first dielectric film forming step S4. As shown in FIG. 6, in the first dielectric film forming step S4, the dielectric film IF1 and the dielectric film IF2 are formed. The dielectric film IF1 and the dielectric film IF2 are formed, for example, by filling a constituent material of the dielectric film IF1 (dielectric film IF2) in the trench TR1 and the trench TR2 using, for example, a CVD method, and then removing the constituent material of the dielectric film IF1 (dielectric film IF2) protruded from the trench TR1 and the trench TR2 by a CMP (Chemical Mechanical Polishing) method.

Figure 7:
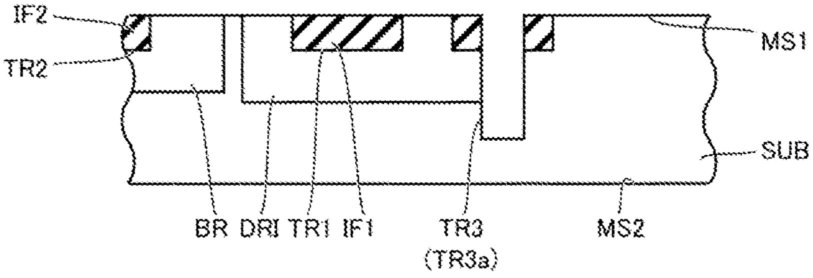
FIG. 7 is a cross-sectional view showing a second trench forming step S5.
Figure 8:
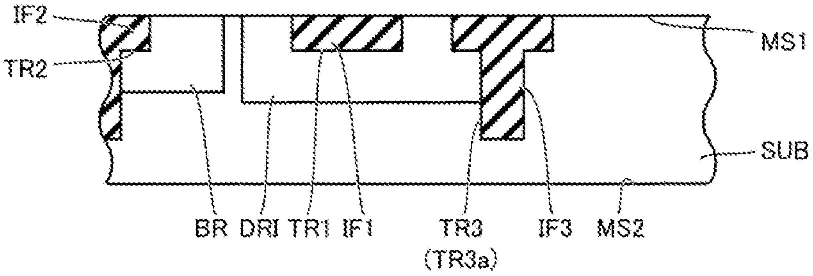
FIG. 8 is a cross-sectional view showing a second dielectric film forming step S6.

FIG. 7 is a cross-sectional view showing the second trench forming step S5. As shown in FIG. 7, in the second trench forming step S5, a trench TR3 is formed. The trench TR3 is formed by, for example, an anisotropic dry etching. FIG. 8 is a cross-sectional view showing the second dielectric film forming step S6. As shown in FIG. 8, in the second dielectric film forming step S6, the dielectric film IF3 is formed. The dielectric film IF3 is formed by, for example, filling a constituent material of the dielectric film IF3 in the trench TR3 using the CVD method, and then removing the constituent material of the dielectric film IF3 protruded from the trench TR3 by the CMP method.

Figure 9:
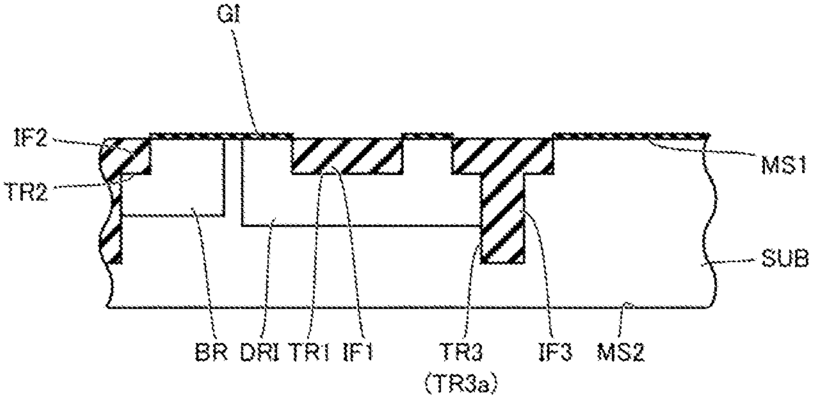
FIG. 9 is a cross-sectional view showing a gate dielectric film forming step S7.
Figure 10:
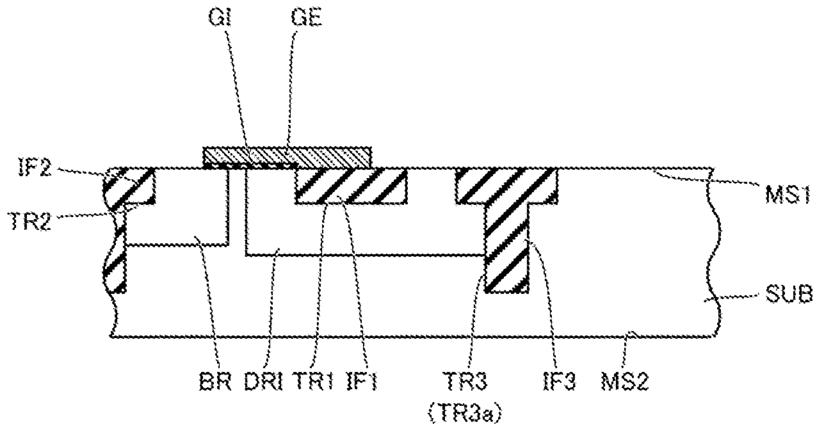
FIG. 10 is a cross-sectional view showing a gate electrode forming step S8.

FIG. 9 is a cross-sectional view showing the gate dielectric film forming step S7. As shown in FIG. 9, in the gate dielectric film forming step S7, for example, thermal oxidization is performed to form a gate dielectric film GI. FIG. 10 is a cross-sectional view showing the gate electrode forming step S8. As shown in FIG. 10, in the gate electrode forming step S8, the gate electrode GE is formed. The gate electrode GE is formed by forming a constituent material of the gate electrode GE by, for example, a CVD method, and then patterning the formed constituent material of the gate electrode GE by dry etching.

Figure 11:
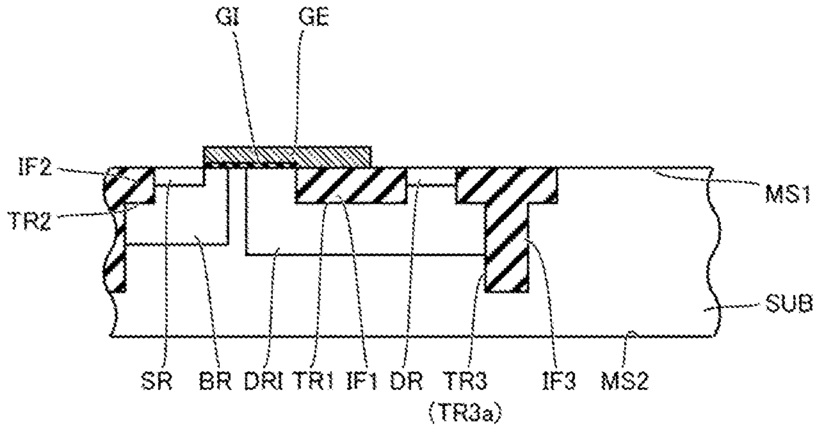
FIG. 11 is a cross-sectional view showing a second ion implantation step S9.
Figure 12:
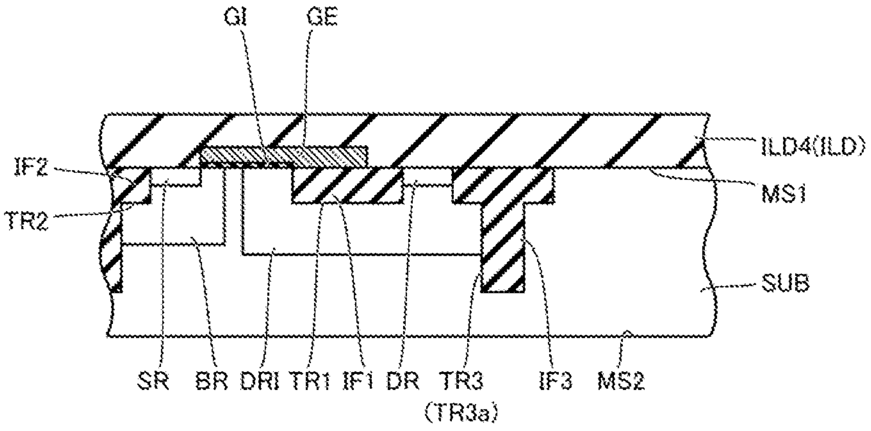
FIG. 12 is a cross-sectional view showing a first interlayer dielectric film forming step S10.

FIG. 11 is a cross-sectional view showing the second ion implantation step S9. As shown in FIG. 11, in the second ion implantation step S9, the source region SR and the drain region DR are formed by ion implantation. FIG. 12 is a cross-sectional view showing the first interlayer dielectric film forming step S10. As shown in FIG. 12, in the first interlayer dielectric film forming step S10, the interlayer dielectric film ILD4 is formed. The interlayer dielectric film ILD4 is formed by forming a constituent material of the interlayer dielectric film ILD4 by, for example, a CVD method and then planarizing the formed constituent material of the interlayer dielectric film ILD4 by a CMP method.

Figure 13:
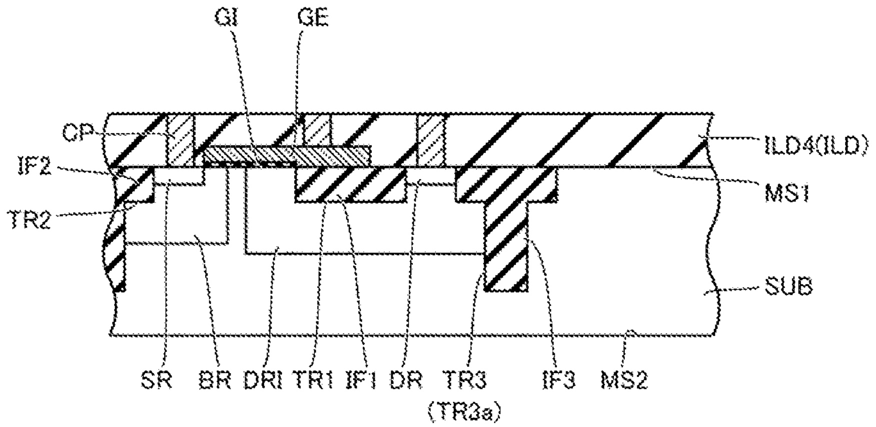
FIG. 13 is a cross-sectional view showing a contact plug forming step S11.
Figure 14:
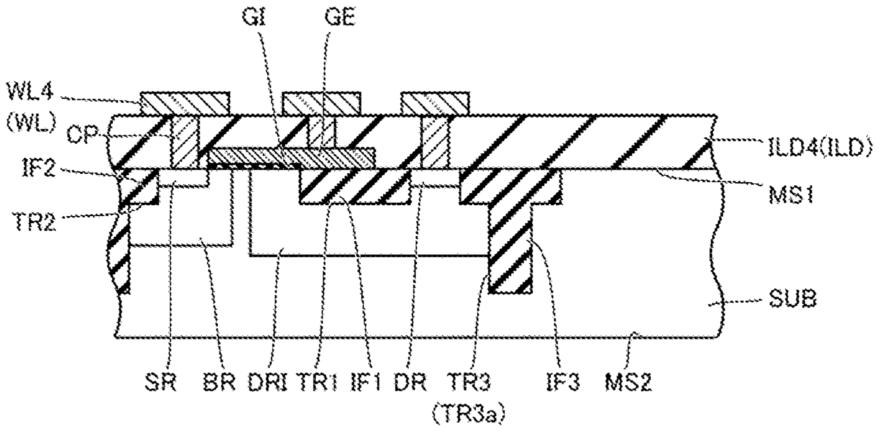
FIG. 14 is a cross-sectional view showing a first wiring forming step S12.

FIG. 13 is a cross-sectional view showing the contact plug forming step S11. As shown in FIG. 13, in the contact plug forming step S11, a contact plug CP is formed. In forming the contact plug CP, first, a contact hole is formed in the interlayer dielectric film ILD4 by dry etching, for example. Second, a constituent material of the contact plug CP is embedded in the contact hole by CVD, for example. Third, the constituent material of the contact plug CP protruded from the contact hole is removed by, for example, a CMP method. Thus, the contact plug CP is formed. FIG. 14 is a cross-sectional view showing the first wiring forming step S12. As shown in FIG. 14, in the first wiring forming step S12, a wiring WL4 is formed. The wiring WL4 is formed by forming a constituent material of the wiring WL4 on the interlayer dielectric film ILD4 by, for example, sputtering, and then patterning the formed constituent material of the wiring WL4 by dry etching.

Figure 15:
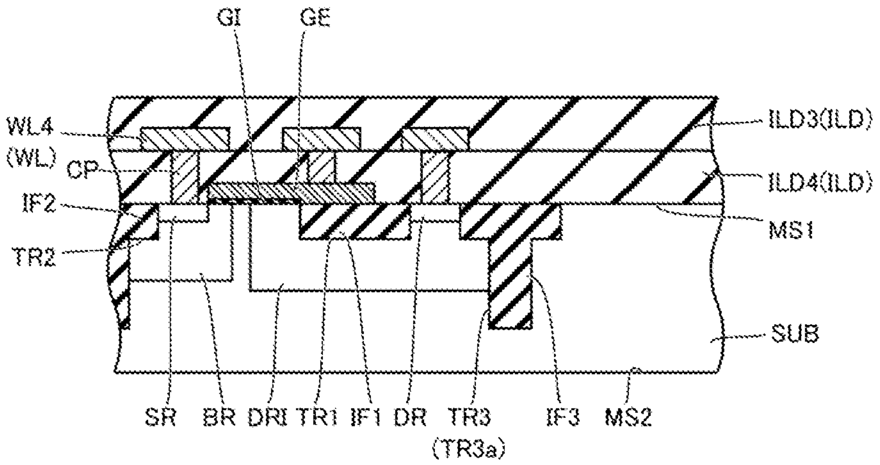
FIG. 15 is a cross-sectional view showing a second interlayer dielectric film forming step S13.
Figure 16:
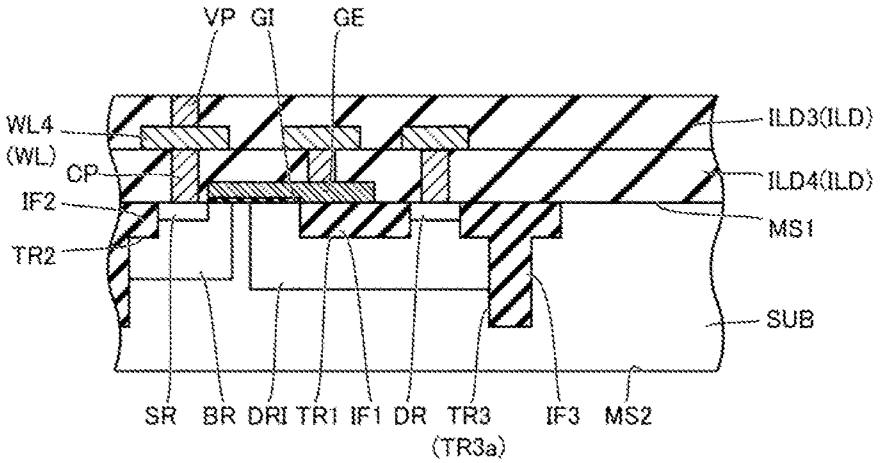
FIG. 16 is a cross-sectional view showing a via plug forming step S14.
Figure 17:
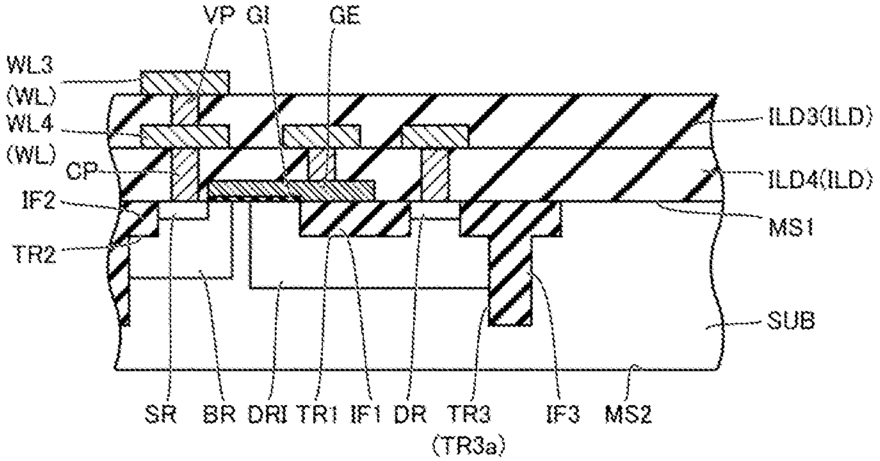
FIG. 17 is a cross-sectional view showing a second wiring forming step S15.

FIG. 15 is a cross-sectional view showing the second interlayer dielectric film forming step S13. As shown in FIG. 13, in the second interlayer dielectric film forming step S13, in the same manner as in the interlayer dielectric film ILD4, the interlayer dielectric film ILD3 is formed on the interlayer dielectric film ILD4 so as to cover the wiring WL4. FIG. 16 is a cross-sectional view showing the via plug forming step S14. As shown in FIG. 16, in the via plug forming step S14, the via plug VP is formed on the interlayer dielectric film ILD3 in the same manner as in the contact plug CP. FIG. 17 is a cross-sectional view showing the second wiring forming step S15. As shown in FIG. 17, in the second wiring forming step S15, a wiring WL3 is formed on the interlayer dielectric film ILD3 in the same manner as in the wiring WL4. By repeating the second interlayer dielectric film forming step S13, the via plug forming step S14, and the second wiring forming step S15, the interlayer dielectric film ILD2, the interlayer dielectric film ILD1, the wiring WL2, the wiring WL1, the via plug VP connecting the wiring WL3 and the wiring WL2, and the via plug VP connecting the wiring WL2 and the wiring WL1 are formed. As described above, the semiconductor device DEV1 having the structure shown in FIGS. 1 and 2 is formed.

First Modified Example

Figure 18:
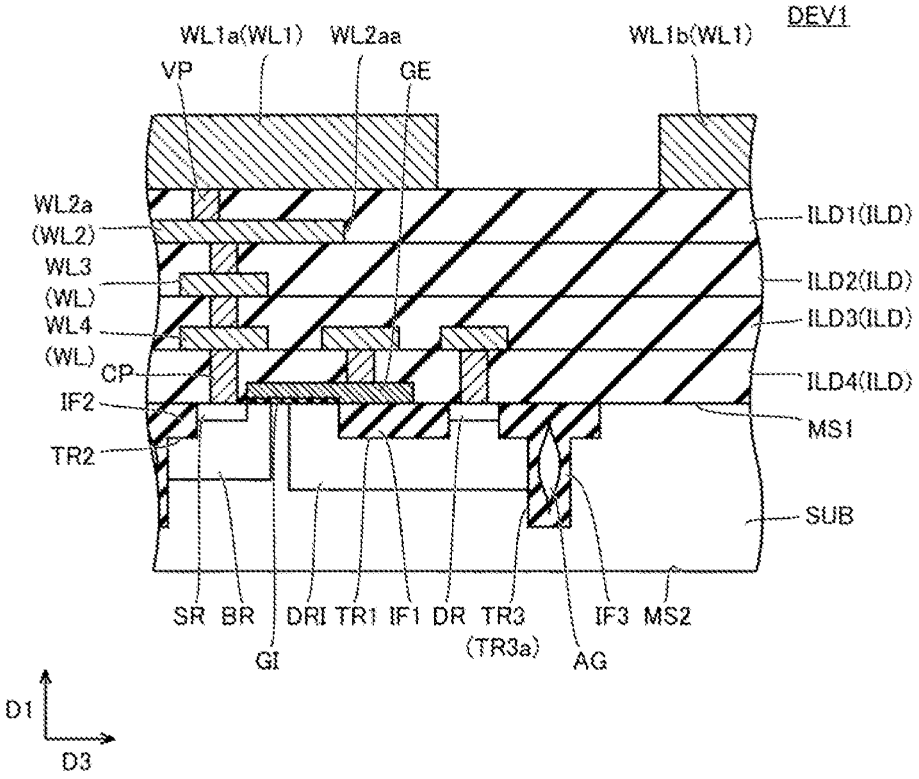
FIG. 18 is a cross-sectional view of the semiconductor device DEV1 according to a first modified example.

FIG. 18 is a cross-sectional view of the semiconductor device DEV1 according to the first modified example. As shown in FIG. 18, there may be a void AG in the dielectric film IF3. The presence of the void AG in the dielectric film IF3 further enhances the dielectric property of the element isolation structure by the trench TR3 and the dielectric film IF3.

Second Modified Example

Figure 19:
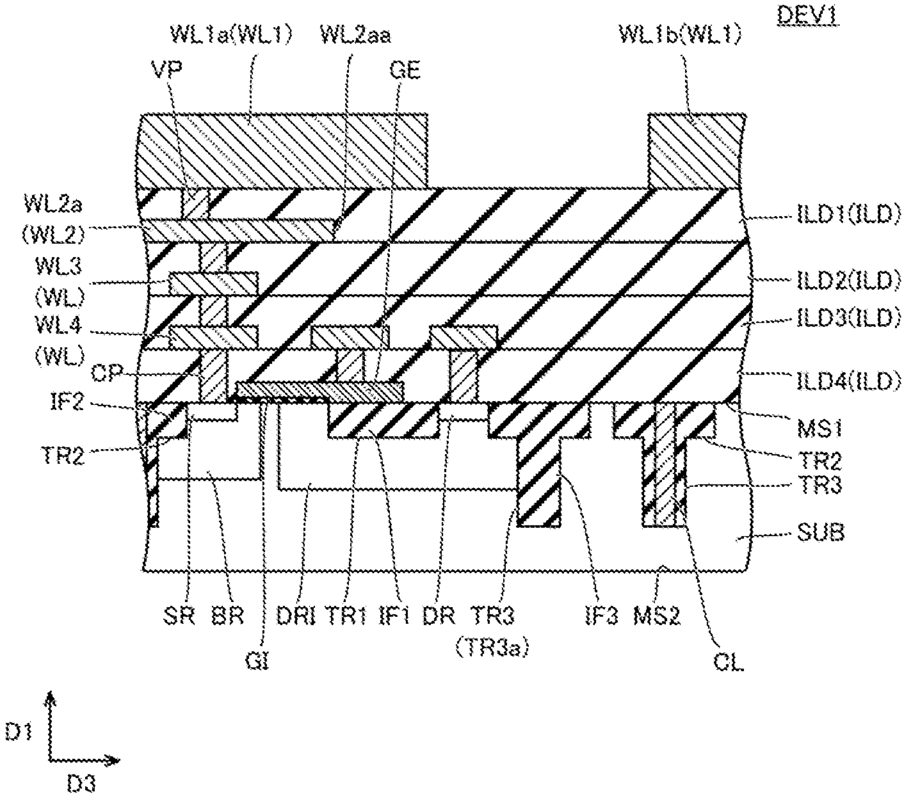
FIG. 19 is a cross-sectional view of the semiconductor device DEV1 according to a second modified example.

FIG. 19 is a cross-sectional view of the semiconductor device DEV1 according to the second modified example. As shown in FIG. 19, the semiconductor device DEV1 may further include a conductive layer CL. The conductive layer CL is formed of, for example, tungsten. The conductive layer CL is embedded in the trench TR3 and is electrically connected to the semiconductor substrate SUB at the bottom of the trench TR3. The dielectric film IF3 is interposed between the inner wall surface of the trench TR3 and the conductive layer CL.

Third Modified Example and Fourth Modified Example

Figure 20:
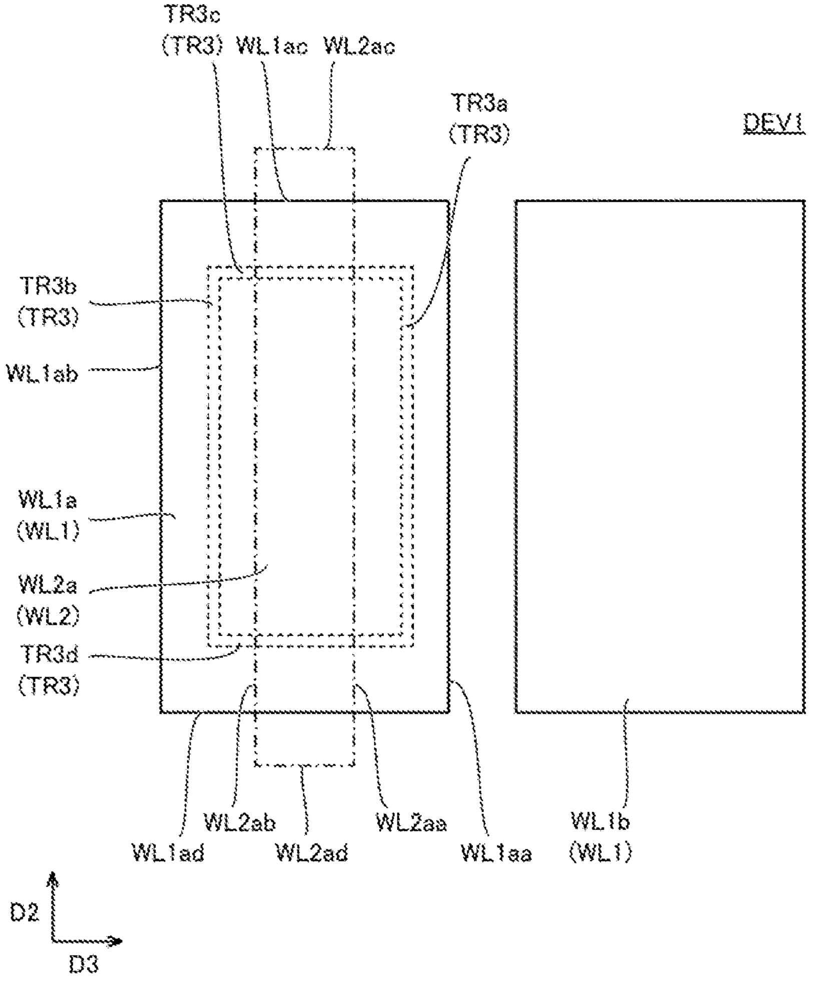
FIG. 20 is a plan view of the semiconductor device DEV1 according to a third modified example.
Figure 21:
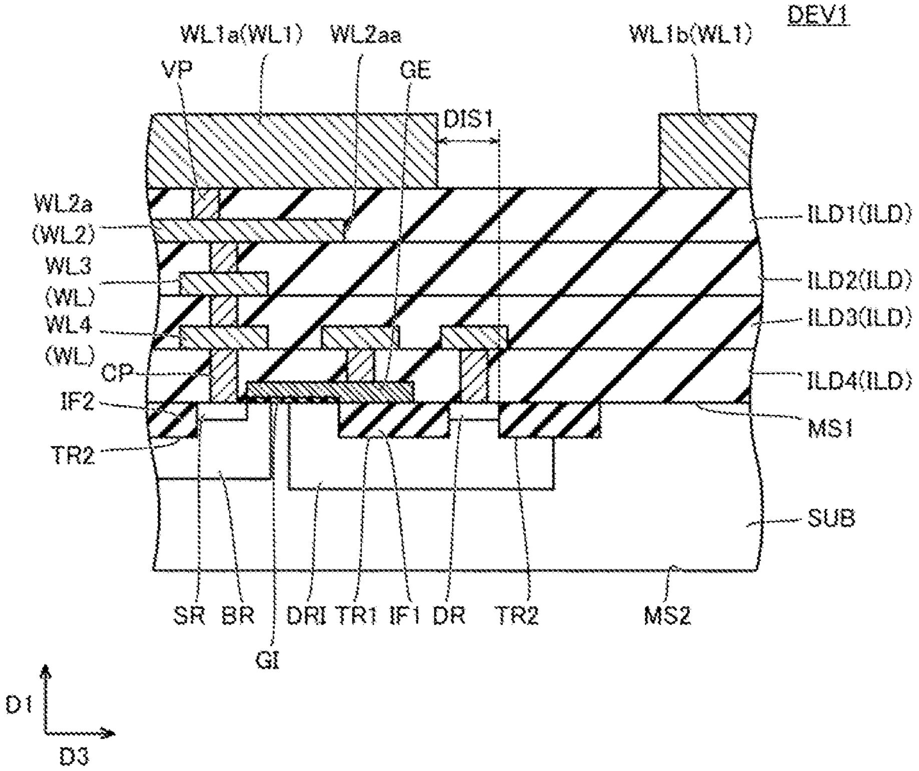
FIG. 21 is a cross-sectional view of the semiconductor device DEV1 according to a fourth modified example.

FIG. 20 is a plan view of the semiconductor device DEV1 according to the third modified example. As shown in FIG. 20, the straight portion TR3*a* may overlap with the wiring portion WL1*a* in the second direction D2. That is, all of the trench TR3 may overlap with the wiring portion WL1*a* in plan view. FIG. 21 is a cross-sectional view of the semiconductor device DEV1 according to the fourth modified example. As shown in FIG. 21, the semiconductor device DEV1 may not have the dielectric film IF3. Here, the distance DIS1 is a distance between the trench TR2 and the end WL1*aa* in the third direction D3.

Fifth Modified Example

Figure 22:
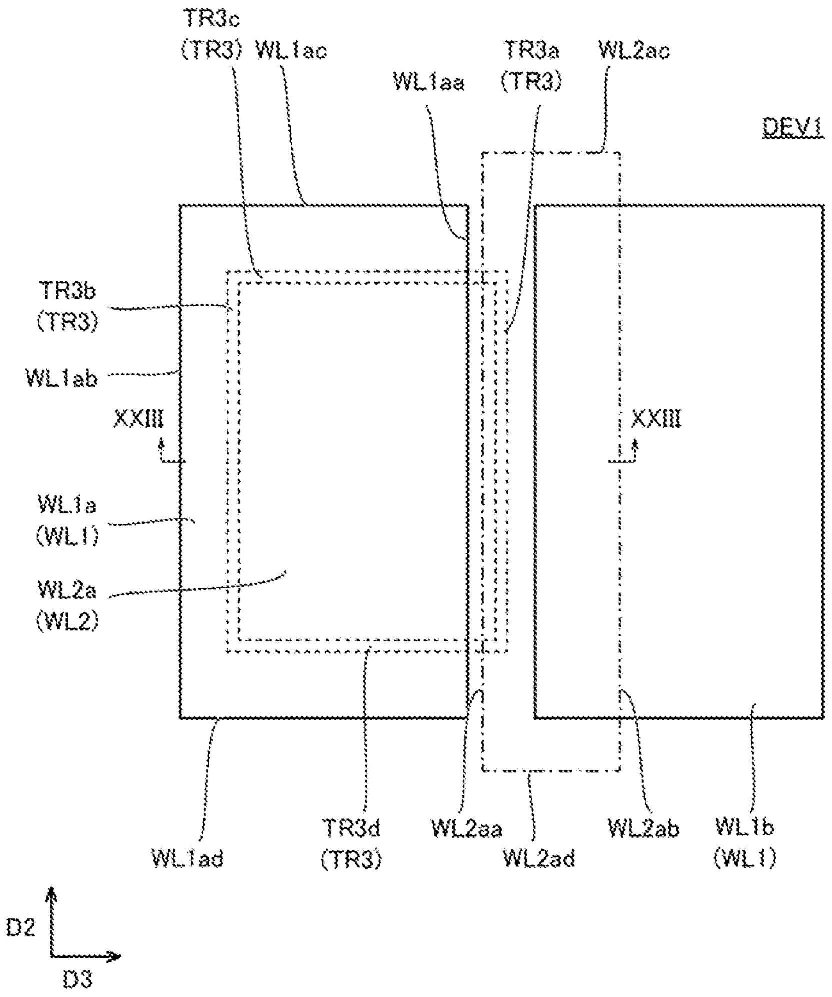
FIG. 22 is a plan view of the semiconductor device DEV1 according to a fifth modified example.
Figure 23:
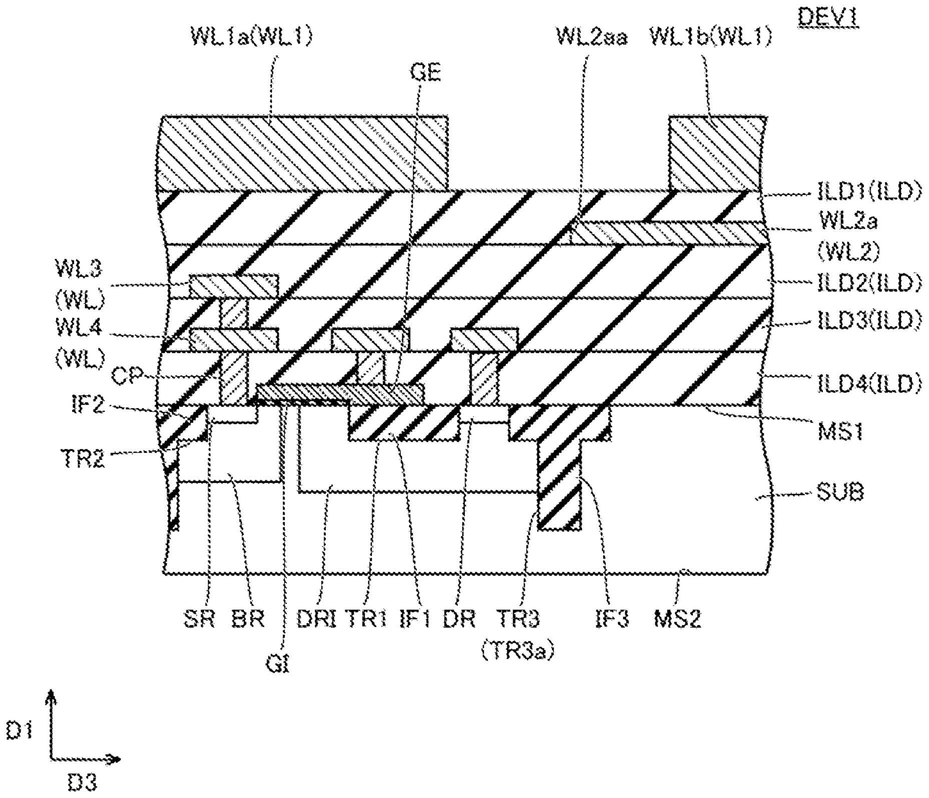
FIG. 23 is a cross-sectional view in XXIII-XXIII of FIG. 22.

FIG. 22 is a plan view of the semiconductor device DEV1 according to the fifth modified example. FIG. 23 is a cross-sectional view of the semiconductor device DEV1 along XXIII-XXIII of FIG. 22. As shown in FIGS. 22 and 23, the end WL2*ab* may not be disposed between the end WL1*aa* and the end WL1*ab* in the third direction D3, and the distance between the end WL2*ab* and the end WL1*aa* in the third direction D3 may be smaller than the distance between the end WL2*ab* and the end WL1*ab* in the third direction D3.

Effects of Semiconductor Device DEV1

The effects of the semiconductor device DEV1 will be described below.

Figure 24:
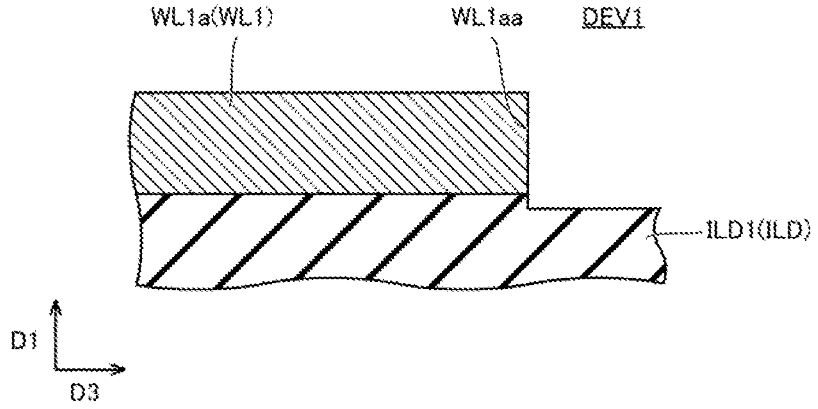
FIG. 24 is a cross-sectional view of the semiconductor device DEV1 in the vicinity of the end WL1*aa*.

FIG. 24 is a cross-sectional view of the vicinity of the end WL1*aa* of the semiconductor device DEV1. As shown in FIG. 24, when the wiring WL1 is formed, overetching is performed, whereby a step is formed on an upper surface of the interlayer dielectric film ILD1 in the vicinity of the end WL1*aa*. In the process of decreasing the temperature after dry etching for forming the wiring WL1 is performed, the difference in the thermal expansion coefficient between the wiring WL1 and the interlayer dielectric film ILD1 causes thermal stresses to concentrate at the step formed on the upper surface of the interlayer dielectric film ILD1. The concentration of the thermal stresses becomes more prominent as the thickness T1 of the wiring WL1 increases (for example, 5 times, 7 times, or 10 times greater than the thickness T2 of the wiring WL2). As a consequence, a crack may occur in the step formed on the upper surface of the interlayer dielectric fil ILD1, and the crack may extend into the plurality of interlayer dielectric films ILD toward the straight portion TR3*a*.

Figure 25A:
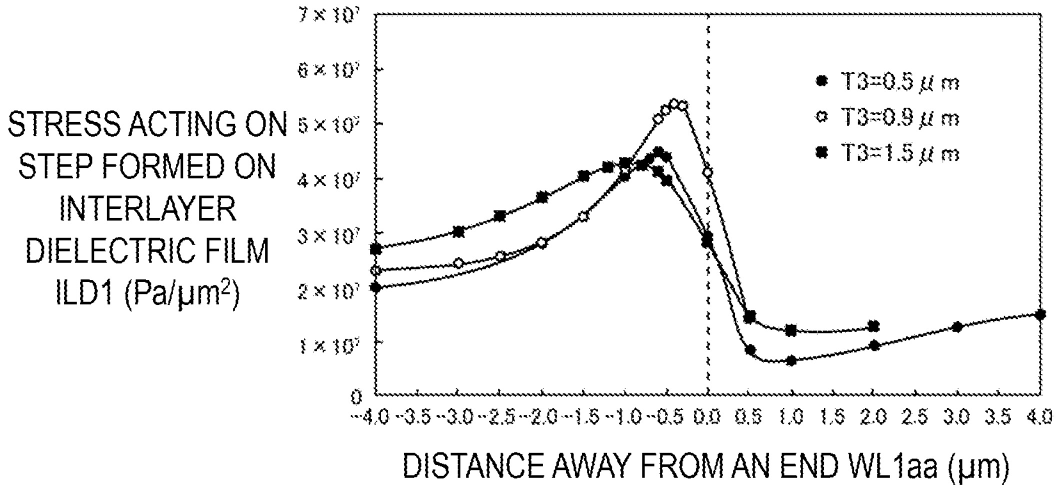
FIG. 25A is a first graph showing a relationship between distances from the end WL1*aa* in the third direction D3 and thermal stresses acting on the step formed on the upper surface of the interlayer dielectric film ILD1 in the vicinity of the end WL1*aa*.
Figure 25B:
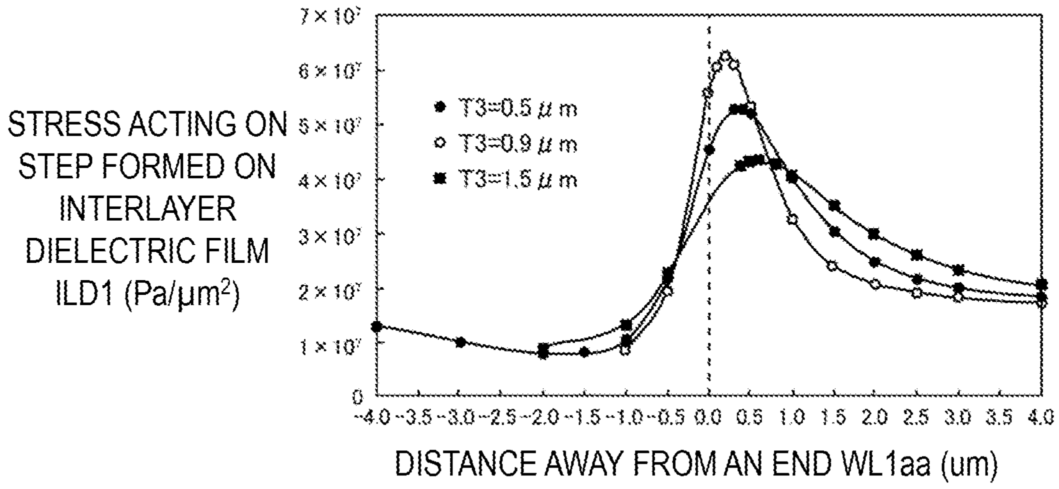
FIG. 25B is a second graph showing a relationship between distances from the end WL1*aa* in the third direction D3 and thermal stresses acting on the step formed on the upper surface of the interlayer dielectric film ILD1 in the vicinity of the end WL1*aa*.

FIG. 25A is a first graph showing a relationship between distances away from the end WL1*aa* in the third direction D3 and thermal stresses acting on the step formed on the upper surface of the interlayer dielectric film ILD1 in the vicinity of the end WL1*aa*. FIG. 25B is a second graph showing a relationship between distances away from the end WL1*aa* in the third direction D3 and thermal stresses acting on the step formed on the upper surface of the interlayer dielectric film ILD1 in the vicinity of the end WL1*aa*. The graph in FIG. 25A is a graph when the end WL2*ab* is not disposed between the end WL1*aa* and the end WL1*ab* in the third direction D3, and the distance between the end WL2*ab* and the end WL1*ab* in the third direction D3 is greater than the distance between the end WL2*ab* and the end WL1*ab* in the third direction D3 (pattern 1). The graph in FIG. 25B is a graph when the end WL2*ab* is not disposed between the end WL1*aa* and the end WL1*ab* in the third direction D3, and the distance between the end WL2*ab* and the end WL1*ab* in the third direction D3 is smaller than the distance between the end WL2*ab* and the end WL1*ab* in the third direction D3 (pattern 2).

In the graph of FIG. 25A and the graph of FIG. 25B, when the end WL2*aa* overlaps with the wiring portion WL1*a* in the third direction D3, the distance from the end WL1*aa* in the third direction D3 is referred to using a negative value, and when the end WL2*aa* does not overlap with the wiring portion WL1*a* in the third direction D3, the distance from the end WL1*aa* in the third direction D3 is referred to using a positive value. The graph of FIG. 25A and the graph of FIG. 25B are obtained by performing a T-CAD (Technology Computer Aided Design) simulation when the thickness T1 of wiring WL1 is set to 3.0 μm and the thickness T3 of the interlayer dielectric film ILD2 on the wiring WL2 is changed.

As shown in FIGS. 25A and 25B, the thermal stresses acting on the step formed on the upper surface of the interlayer dielectric film ILD1 in the vicinity of the end WL1*aa* has a peak within a distance in which the distance from the end WL1*aa* in the third direction D3 is 1.5 μm or less (that is, the distance from the end WL1*aa* in the third direction D3 is 0.5 times or less of the thickness WL1*aa*). In the semiconductor device DEV1, since the distance DIS2 between the end WL1*aa* and the end WL2*aa* in the third direction D3 is more than 0.5 times the thickness T1 of wiring WL1, the thermal stresses acting on the step formed on the upper surface of the interlayer dielectric film ILD1 in the vicinity of the end WL1*aa* are smaller than the above-described peak. Therefore, in the semiconductor device DEV1, the extension of the crack is suppressed.

Figure 25C:
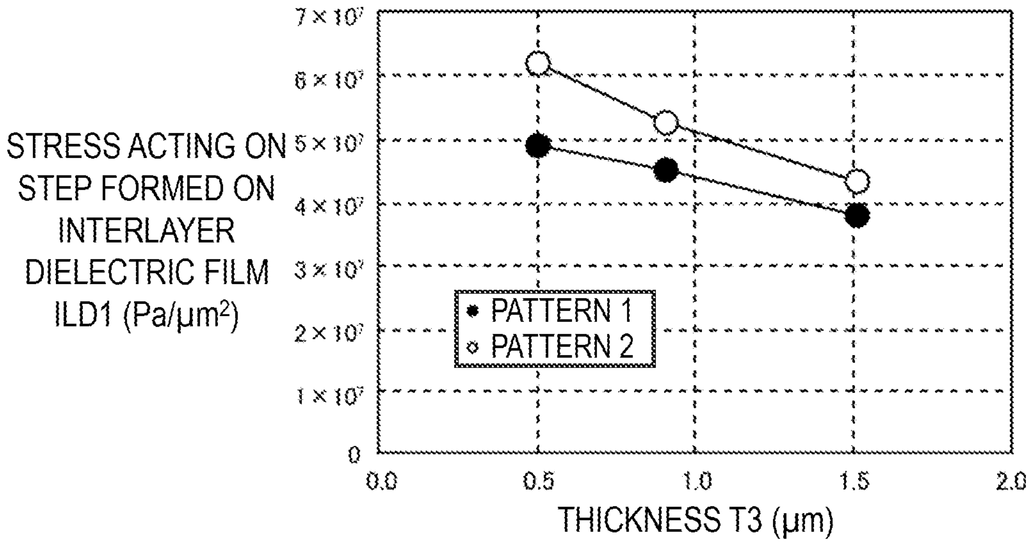
FIG. 25C is a graph showing a relationship between a thickness T3 and the maximum value of the thermal stresses acting on the step formed on the upper surface of the interlayer dielectric film ILD1 in the vicinity of the end WL1*aa*.

FIG. 25C is a graph showing a relationship between a thickness T3 of the interlayer dielectric film ILD2 on the wiring WL2 and the maximum value of the thermal stresses acting on the step formed on the upper surface of the interlayer dielectric film ILD1 in the vicinity of the end WL1*aa*. The graph of FIG. 25C is obtained from the graph of FIG. 25A and the graph of FIG. 25B. As shown in FIG. 25C, the maximal thermal stresses acting on the step formed on the upper surface of the interlayer dielectric film ILD1 in the vicinity of the end WL1*aa* decrease as the thickness T3 decreases. Therefore, in the semiconductor device DEV1, by setting the thickness T3 to 0.5 μm or more (1.0 μm or more, 1.5 μm or more), it is possible to further suppress the extension of the crack caused by the concentration of the thermal stresses in the step formed on the upper surface of the interlayer dielectric film ILD1.

Figure 25D:
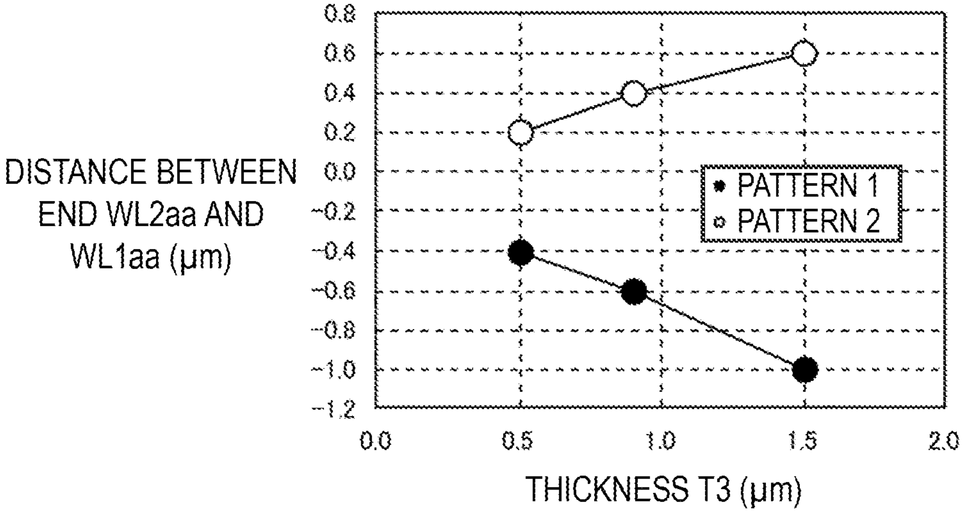
FIG. 25D is a graph showing a relationship between the thickness T3 and a position of the end WL2*aa* where the thermal stresses acting on the step formed on the upper surface of the interlayer dielectric film ILD1 in the vicinity of the end WL1*aa* is maximized.

FIG. 25D is a graph showing a relationship between the thickness T3 of the interlayer dielectric film ILD2 on the wiring WL2 and a position of the end WL2*aa* where the thermal stresses acting on the step formed on the upper surface of the interlayer dielectric film ILD1 in the vicinity of the end WL1*aa* is maximized. The graph of FIG. 25D is obtained from the graph of FIG. 25A and the graph of FIG. 25B. As shown in FIG. 25D, the smaller the thickness T3 is, the smaller the distance between the position of the end WL2*aa* where the thermal stresses acting on the step formed on the upper surface of the interlayer dielectric film ILD1 in the vicinity of the end WL1*aa* are maximized and the end WL1*aa*. Therefore, by reducing the thickness T3, the end WL2*aa* can be disposed close to the end WL1*aa*, and wiring arrangement becomes more flexible.

Based on FIG. 25D, when the distance between the position where the thermal stresses acting on the step formed on the upper surface of the interlayer dielectric film ILD1 in the vicinity of the end WL1*aa* is maximized and the end WL1*aa* is referred to as X (unit: μm) and the thickness T3 is referred to as T3 (unit: μm), X is 0.6T3+0.1 in the case of the first pattern and is −0.4-0.02T3 in the case of the second pattern. When X is a negative value in this equation, it means that the position where the thermal stresses acting on the step formed on the upper surface of the interlayer dielectric film ILD1 in the vicinity of the end WL1*aa* is maximized overlaps with the wiring portion WL1*a* in the third direction D3.

Similarly, a step is formed in an upper surface of the interlayer dielectric film ILD1 in the vicinity of the end WL1*ac*. The end WL1*aa* also receives stresses from the wiring portion WL1*b*, while the end WL1*ac* does not receive stresses from the adjacent wiring portion. Therefore, thermal stresses are less likely to concentrate in the step formed in the vicinity of the end WL1*ac* than the step formed in the vicinity of the end WL1*aa*. Therefore, even if the distance DIS3 between the end WL1*ac* and the end WL2*ac* in the second direction D2 is smaller than the distance DIS1 between the end WL1*aa* and the straight portion TR3*a* in the third direction D3, the extension of the crack caused by the thermal stresses acting on the step formed on the upper surface of the interlayer dielectric film ILD1 in the vicinity of the end WL1*ac* can be suppressed.

Second Embodiment

A semiconductor device according to the second embodiment will be described. The semiconductor device according to the second embodiment is a semiconductor device DEV2. Here, differences from the semiconductor device DEV1 will be mainly described, and redundant description will not be repeated.

Configuration of Semiconductor Device DEV2

The configuration of the semiconductor device DEV2 will be described below.

The semiconductor device DEV2 includes a semiconductor substrate SUB, a dielectric film IF1, a dielectric film IF2, a dielectric film IF3, a gate dielectric film GI, a gate electrode GE, a plurality of wirings WL, a plurality of interlayer dielectric films ILD, a contact plug CP, and a via plug VP. In this regard, the configuration of the semiconductor device DEV2 is the same as the configuration of the semiconductor device DEV1.

Figure 26:
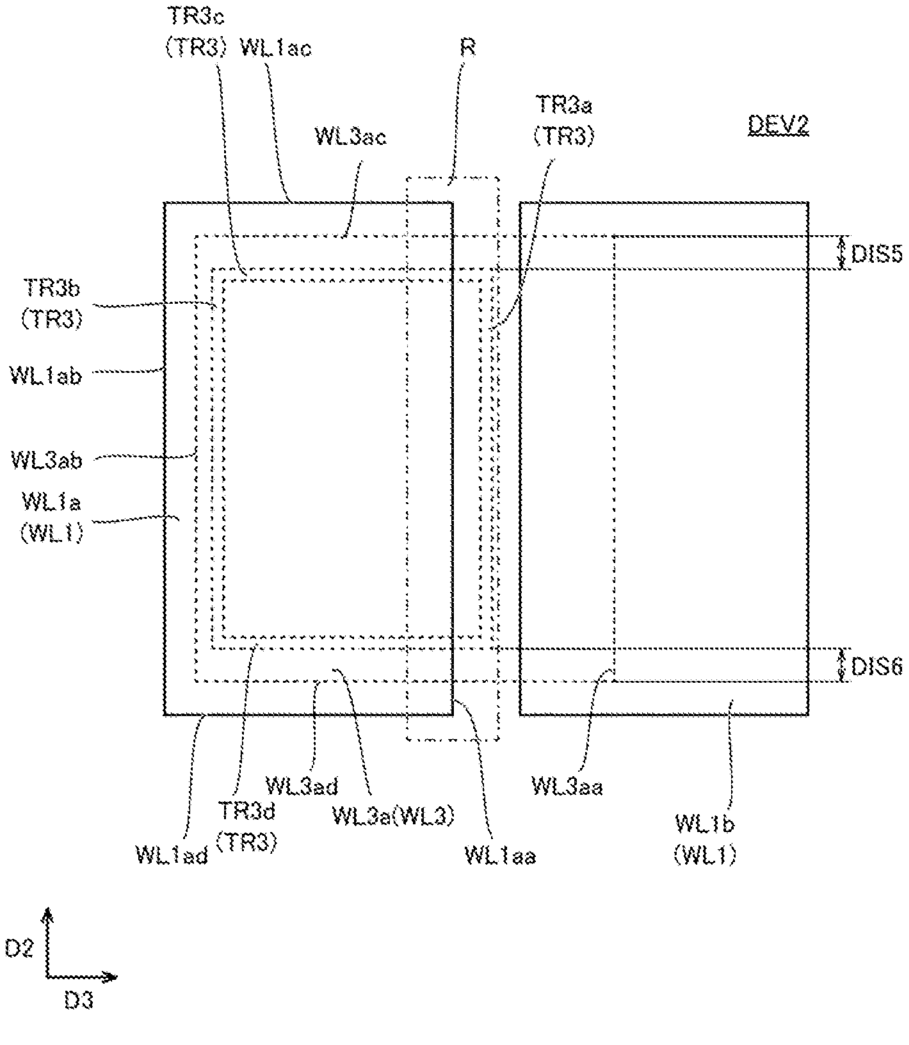
FIG. 26 is a plan view of a semiconductor device DEV2.

FIG. 26 is a plan view of the semiconductor device DEV2. As shown in FIG. 26, in the semiconductor device DEV2, the wiring WL3 includes a wiring portion WL3*a*. The wiring portion WL3*a* extends along the third direction D3 so as to intersect with a region R. The region R is a region in which the distance from the end WL1*aa* in the third direction D3 is 0.5 times or less of the thickness T1. Note that both ends of the region R in the second direction D2 may be located at positions protruding from the end WL1*ac* and the end WL1*ad* in the second direction D2, respectively, for example. The protruding distance from the end WL1*ac* to the of the region R is, for example, 10 μm.

The wiring portion WL3*a* includes an end WL3*aa* and an end WL3*ab* opposite to the end WL3*aa* in the third direction D3. The end WL3*aa* overlaps with, for example, the wiring portion WL1*b* in the third direction D3. The end WL3*ab* overlaps with, for example, the wiring portion WL1*a* in the third direction D3.

The wiring portion WL3*a* includes an end WL3*ac* and an end WL3*ad* opposite to the end WL3*ac* in the second direction D2. A distance DIS5 between the end WL3*ac* and the straight portion TR3*c* in the second direction D2 is smaller than the distance between the end WL3*ac* and the straight portion TR3*d* in the second direction D2. A distance DIS6 between the end WL3*ad* in the second direction D2 is smaller than the distance between the end WL3*ad* and the straight portion TR3*c* in the second direction D2. The straight portions TR3*c* and TR3*d* are disposed between the end WL3*ac* and the end WL3*ad* in the second direction D2. The distance DIS5 and the distance DIS6 are preferable 0.5 times or more of the thickness T1 of the wiring WL1, and more preferably 1.0 times or more of the thickness T1. In these respects, the configuration of the semiconductor device DEV2 is different from the configuration of the semiconductor device DEV1.

Effect of Semiconductor Device DEV2

The effects of the semiconductor device DEV2 will be described below.

In the semiconductor device DEV2, even if the crack is generated due to the thermal stresses acting on the step formed on the upper surface of the interlayer dielectric film ILD1 in the vicinity of the end WL1*ac* and the crack extends in the interlayer dielectric film ILD toward the straight portion TR3*a*, since the wiring portion WL3*a* extends along the third direction D3 so as to intersect with the region R, the extension of the crack likely stops by contacting the wiring portion WL3*a*. As a consequence, according to the semiconductor device DEV2, the crack is less likely to extend below the wiring WL3.

Third Embodiment

A semiconductor device according to the third embodiment will be described. The semiconductor device according to the third embodiment is a semiconductor device DEV3. Here, differences from the semiconductor device DEV2 will be mainly described, and redundant description will not be repeated.

Configuration of Semiconductor Device DEV3

The configuration of the semiconductor device DEV3 will be described below.

The semiconductor device DEV3 includes a semiconductor substrate SUB, a dielectric film IF1, a dielectric film IF2, a dielectric film IF3, a gate dielectric film GI, a gate electrode GE, a plurality of wirings WL, a plurality of interlayer dielectric films ILD, a contact plug CP, and a via plug VP. In this regard, the configuration of the semiconductor device DEV3 is the same as the configuration of the semiconductor device DEV2.

Figure 27:
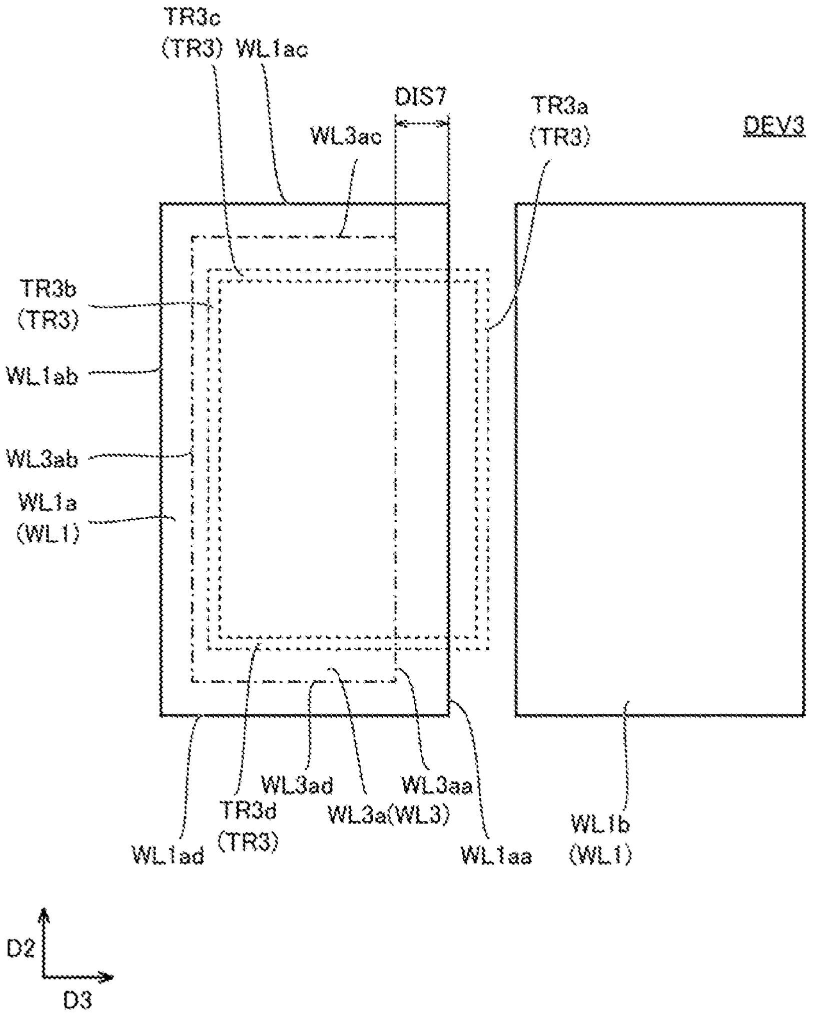
FIG. 27 is a plan view of a semiconductor device DEV3.

FIG. 27 is a plan view of the semiconductor device DEV3. In the semiconductor device DEV3, a distance DIS7 between the end WL3*aa* and the end WL1*aa* in the third direction D3 is smaller than the distance between the end WL3*ab* and the end WL1*aa* in the third direction D3. The distance DIS7 is greater than 0.5 times the thickness T1 of the wiring WL1. The distance DIS7 is preferably 1.0 times or more of the thickness T1. In these respects, the configuration of the semiconductor device DEV3 is different from the configuration of the semiconductor device DEV2.

Effect of Semiconductor Device DEV3

The effects of the semiconductor device DEV3 will be described below.

The thermal stresses acting on the step formed on the upper surface of the interlayer dielectric film ILD1 in the vicinity of the end WL1*ac* generate a crack, and the crack extends into the vicinity of the end WL3*aa*. In such a case, if the distance between the end WL1*aa* and the end WL3*aa* in the third direction D3 is small, the stress concentrates at the end of the crack and causes the crack further extend.

In the semiconductor device DEV3, since the distance DIS7 between the end WL3*aa* and the end WL1*aa* in the third direction D3 is greater than 0.5 times the thickness T1 of the wiring WL1, even if the crack extends to the vicinity of the end WL3*aa*, the stress concentration at the end of the crack is suppressed. Therefore, according to the semiconductor device DEV3, even if the crack extends to the vicinity of the end WL3*aa*, further extension of the crack can be suppressed.

Fourth Embodiment

A semiconductor device according to the fourth embodiment will be described. The semiconductor device according to the fourth embodiment is a semiconductor device DEV4. Here, differences from the semiconductor device DEV2 will be mainly described, and redundant description will not be repeated.

Configuration of Semiconductor Device DEV4

The configuration of the semiconductor device DEV4 will be described below.

The semiconductor device DEV4 includes a semiconductor substrate SUB, a dielectric film IF1, a dielectric film IF2, a dielectric film IF3, a gate dielectric film GI, a gate electrode GE, a plurality of wirings WL, a plurality of interlayer dielectric films ILD, a contact plug CP, and a via plug VP. In this regard, the configuration of the semiconductor device DEV4 is the same as the configuration of the semiconductor device DEV2.

Figure 28:
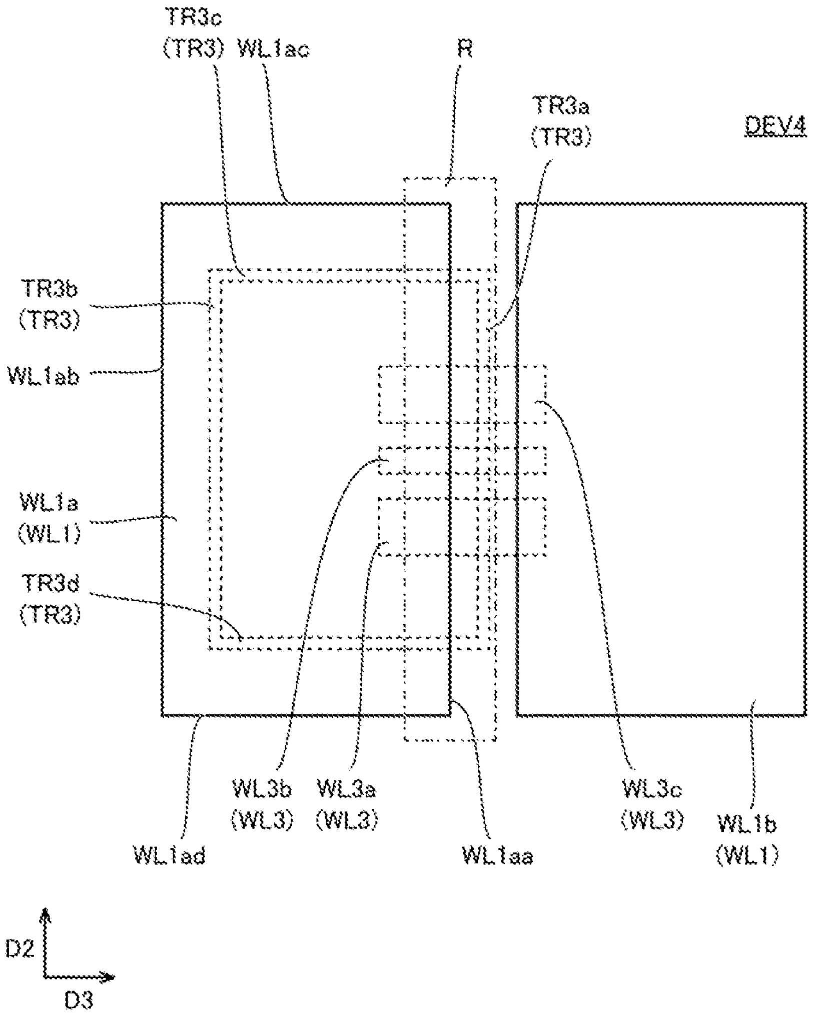
FIG. 28 is a plan view of a semiconductor device DEV4.

FIG. 28 is a plan view of the semiconductor device DEV4. As shown in FIG. 28, in the semiconductor device DEV3, the wiring WL3 further includes a dummy wiring portion WL3*b* and a dummy wiring portion WL3*c*. The dummy wiring portion WL3*b* and the dummy wiring portion WL3*c* extend along the third direction D3 so as to intersect with the region R. The wiring portion WL3*a* is disposed between the dummy wiring portion WL3*b* and the dummy wiring portion WL3*c* in the second direction D2. A width of the dummy wiring portion WL3*b* in the second direction D2 and a width of the dummy wiring portion WL3*c* in the second direction D2 are preferably 10 μm or more. The width of the dummy wiring portion WL3*b* in the second direction D2 and the width of the dummy wiring portion WL3*c* in the second direction D2 are preferably 20 μm or more. The width of the wiring portion WL3*a* in the second direction D2 is preferably equal to or less than the distance between the wiring portion WL3*a* and the dummy wiring portion WL3*b* (dummy wiring portion WL3*c*) in the second direction D2.

In the embodiment shown in FIG. 28, the number of the wiring portion WL3*a* disposed between the dummy wiring portion WL3*b* and the dummy wiring portion WL3*c* is one, but the number of the wiring portion WL3*a* disposed between the dummy wiring portion WL3*b* and the dummy wiring portion WL3*c* may be plural. In the semiconductor device DEV4, although not shown, the wiring WL3 may further include other dummy wiring portions. The dummy wiring portion WL3*b* and the dummy wiring portion WL3*c* are disposed between the other dummy wiring portions in the second direction D2. In these respects, the configuration of the semiconductor device DEV4 is different from the configuration of the semiconductor device DEV2.

Effect of Semiconductor Device DEV4

The effects of the semiconductor device DEV4 will be described below.

As described above, in the semiconductor device DEV2, the wiring portion WL3*a* extends along the third direction D3 so as to intersect with the region R. Therefore, even if a crack is generated due to thermal stresses acting on the step formed on the upper surface of the interlayer dielectric film ILD1 in the vicinity of the end WL1*ac* and the crack extends in the interlayer dielectric film ILD toward the straight portion TR3*a*, the extension of crack likely stops by contacting the wiring portion WL3*a*.

However, if the crack extends away from the wiring portion WL3*a*, the wiring portion WL3*a* cannot stop the crack. In the semiconductor device DEV4, even if the crack extends away from the wiring portion WL3*a*, the extension of the crack is easily stopped by the dummy wiring portion WL3*b* and the dummy wiring portion WL3*c* because the dummy wiring portion WL3*b* and the dummy wiring portion WL3*c* extending along the third direction D3 so as to intersect with the region R are disposed next to the wiring portion WL3*a*.

Fifth Embodiment

A semiconductor device according to the fifth embodiment will be described. The semiconductor device according to the fifth embodiment is a semiconductor device DEV5. Here, differences from the semiconductor device DEV2 will be mainly described, and redundant description will not be repeated.

Configuration of Semiconductor Device DEV5

The configuration of the semiconductor device DEV5 will be described below.

The semiconductor device DEV5 includes a semiconductor substrate SUB, a dielectric film IF1, a dielectric film IF2, a dielectric film IF3, a gate dielectric film GI, a gate electrode GE, a plurality of wirings WL, a plurality of interlayer dielectric films ILD, a contact plug CP, and a via plug VP. In this regard, the configuration of the semiconductor device DEV5 is the same as the configuration of the semiconductor device DEV2.

Figure 29:
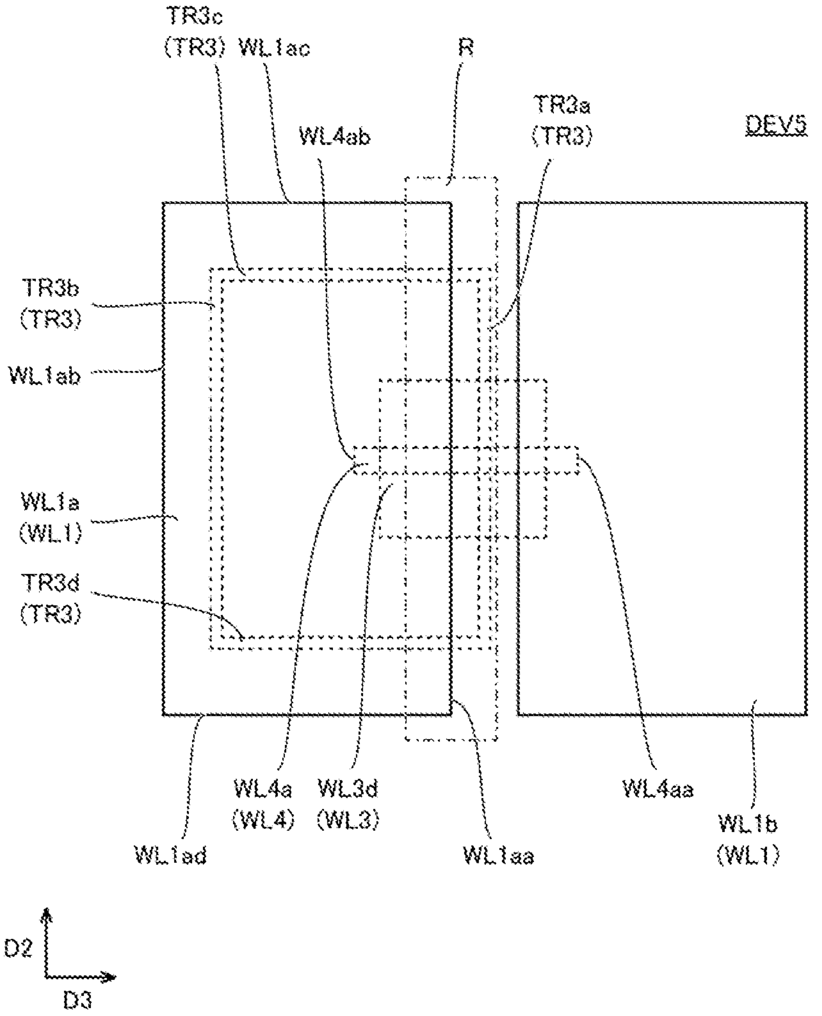
FIG. 29 is a plan view of a semiconductor device DEV5.

FIG. 29 is a plan view of the semiconductor device DEV5. As shown in FIG. 29, in the semiconductor device DEV5, the wiring WL3 does not include the wiring portion WL3*a*, and the wiring WL3 includes a dummy wiring portion WL3*d*. The dummy wiring portion WL3*d* extends along the third direction D3 so as to intersect with the region R. A width of the wiring portion WL3*d* in the third direction D3 is preferable 20 μm or more. Although not shown, in the semiconductor device DEV5, the wiring WL3 may further include other dummy wiring portions.

In the semiconductor device DEV5, the wiring WL4 includes a wiring portion WL4*a*. The wiring portion WL4*a* extends along the third direction D3 so as to intersect with the region R. The wiring portion WL4*a* includes an end WL4*aa* and an end WL4*ab* opposite to the end WL4*aa* in the third direction D3. The end WL4*aa* overlaps with, for example, the wiring portion WL1*b* in the third direction D3. The end WL4*ab* overlaps with, for example, the wiring portion WL1*a* in the third direction D3. The wiring portion WL4*a* overlaps with the dummy wiring portion WL3*d* in the second direction D2. A distance between the end of the dummy wiring portion WL3*d* in the second direction D2 and the end of the wiring portion WL4*a* in the second direction D2 is preferable 10 μm or more. In these respects, the configuration of the semiconductor device DEV5 is different from the configuration of the semiconductor device DEV2.

Effect of Semiconductor Device DEV5

The effects of the semiconductor device DEV5 will be described below.

In the semiconductor device DEV5, the dummy wiring portion WL3*d* extends along the third direction D3 so as to intersect with the region R. Therefore, even if a crack is generated due to thermal stresses acting on the step formed on the upper surface of the interlayer dielectric film ILD1 in the vicinity of the end WL1*ac* and the crack extends in the interlayer dielectric film ILD toward the straight portion TR3*a*, the extension of the crack likely stops by contacting the dummy wiring portion WL3*d*. According to the semiconductor device DEV5, the crack is less likely to extend below the wiring WL3, and the wiring portion WL4*a* can be protected from the crack.

Although the invention made by the present inventors has been described in detail based on the embodiments, it is needless to say that the present invention is not limited to the above-described embodiments and can be variously modified without departing from the gist thereof.

What is claimed is:

1. A semiconductor device comprising:

a semiconductor substrate having a first main surface and a second main surface which is an opposite surface of the first main surface;

a plurality of interlayer dielectric films stacked on the first main surface along a first direction which is a normal direction of the first main surface; and a plurality of wirings, wherein a trench recessed toward the second main surface is formed on the first main surface, wherein the trench includes a straight portion extending along a second direction orthogonal to the first direction, wherein the plurality of interlayer dielectric films includes:

a first interlayer dielectric film disposed farthest from the first main surface in the first direction; and a second interlayer dielectric film disposed in contact with the first interlayer dielectric film in the first direction, wherein the plurality of wirings includes:

a first wiring disposed on the first interlayer dielectric film; and a second wiring disposed on the second interlayer dielectric film so as to be covered with the first interlayer dielectric film, wherein the first wiring includes a first wiring portion, wherein, in a third direction orthogonal to the first direction and the second direction, the first wiring portion includes:

a first end; and a second end which is an opposite end of the first end, wherein the second wiring includes a second wiring portion, wherein, in the third direction, the second wiring portion includes:

a third end; and a fourth end which is an opposite end of the third end, wherein a distance between the straight portion and the first end in the third direction is smaller than a distance between the straight portion and the second end in the third direction, and is 0.5 times or less of a first thickness which is a thickness of the first wiring in the first direction, and wherein a distance between the first end and the third end in the third direction is smaller than a distance between the first end and the fourth end in the third direction, and is greater than 0.5 times the first thickness.

2. The semiconductor device according to claim 1, wherein the first wiring includes a third wiring portion, wherein the third wiring portion is arranged spaced apart from the first wiring portion in the third direction, wherein, in plan view, the straight portion is disposed between the first wiring portion and the third wiring portion in the third direction.

3. The semiconductor device according to claim 1, wherein, in the second direction, the first wiring portion includes:

a fifth end; and a sixth end which is an opposite end of the fifth end, wherein, in the second direction, the second wiring portion includes:

a seventh end; and an eighth end which is an opposite end of the seventh end, and wherein a distance between the fifth end and the seventh end in the second direction is smaller than a distance between the fifth end and the eighth end in the second direction, and is smaller than the distance between the first end and the third end in the third direction.

4. The semiconductor device according to claim 1, wherein the straight portion overlaps with the first wiring portion in the second direction.

5. The semiconductor device according to claim 1, wherein the first thickness is 10 times or more of a second thickness which is a thickness of the second wiring in the first direction.

6. The semiconductor device according to claim 1, wherein the plurality of interlayer dielectric films includes a third interlayer dielectric film disposed in contact with a side of the second interlayer dielectric film that is opposite to a side of the third interlayer dielectric film that contacts the first interlayer dielectric film in the first direction, wherein the plurality of wirings includes a third wiring disposed on the third interlayer dielectric film so as to be covered with the second interlayer dielectric film, wherein the third wiring includes a fourth wiring portion, and wherein the fourth wiring portion extends along the third direction so as to intersect with a region in which a distance from the first end in the third direction is 0.5 times or less of the first thickness.

7. The semiconductor device according to claim 6, wherein the third wiring includes a first dummy wiring portion and a second dummy wiring portion each extending along the third direction so as to intersect with the region, and wherein the fourth wiring portion is between the first dummy wiring portion and the second dummy wiring portion in the second direction.

8. The semiconductor device according to claim 1, wherein the plurality of interlayer dielectric films includes a third interlayer dielectric film disposed in contact with a side of the second interlayer dielectric film that is opposite to a side of the second interlayer dielectric film that contacts the first interlayer dielectric film in the first direction, wherein the plurality of wirings includes a third wiring disposed on the third interlayer dielectric film so as to be covered with the second interlayer dielectric film, wherein the third wiring includes a fourth wiring portion, wherein, in the third direction, the fourth wiring portion includes:

a ninth end; and a tenth end which is an opposite end of the ninth end, and wherein a distance between the first end and the ninth end in the third direction is smaller than a distance between the first end and the tenth end in the third direction, and is 0.5 times or more of the first thickness.

9. The semiconductor device according to claim 1, wherein the plurality of interlayer dielectric films includes:

a third interlayer dielectric film in contact with the second interlayer dielectric film from the side opposite to the first interlayer dielectric film in the first direction; and a fourth interlayer dielectric film in contact with the third interlayer dielectric film from the side opposite to the second interlayer dielectric film in the first direction, wherein the plurality of wirings includes:

a third wiring disposed on the third interlayer dielectric film so as to be covered with the second interlayer dielectric film; and a fourth wiring disposed on the fourth interlayer dielectric film so as to be covered with the third interlayer dielectric film, wherein the third wiring includes a third dummy wiring portion, wherein the third dummy wiring portion extends along the third direction so as to intersect with a region between the third end and the straight portion in the third direction, wherein the fourth wiring includes a fifth wiring portion, wherein the fifth wiring portion extends along the third direction so as to intersect with the region, and wherein the fifth wiring portion overlaps with the third dummy wiring portion in the second direction.

10. The semiconductor device according to claim 1, comprising a dielectric film embedded in the trench.

11. The semiconductor device according to claim 10, wherein a void is included inside of the dielectric film.

12. The semiconductor device according to claim 10, wherein the semiconductor substrate includes:

a source region disposed on the first main surface;

a drain region disposed spaced apart from the source region on the first main surface;

a body region disposed on the first main surface so as to surround the source region; and a drift region disposed so as to surround the drain region, and wherein a bottom of the trench is closer to the second main surface than the drift region.

13. The semiconductor device according to claim 1, comprising:

a conductive layer embedded in the trench; and a dielectric film interposed between the conductive layer and an inner wall surface of the trench, wherein the conductive layer is electrically connected to the semiconductor substrate at the bottom of the trench.

* * * * *